United States Patent
Lee et al.

(10) Patent No.: US 7,804,720 B2
(45) Date of Patent: Sep. 28, 2010

(54) INTEGRATED CIRCUIT MEMORY DEVICES INCLUDING MODE REGISTERS SET USING A DATA INPUT/OUTPUT BUS

(75) Inventors: Kee-hoon Lee, Gyeonggi-do (KR); Chang-sik Yoo, Seoul (KR); Kye-hyun Kyung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/614,826

(22) Filed: Nov. 9, 2009

(65) Prior Publication Data

US 2010/0054053 A1 Mar. 4, 2010

Related U.S. Application Data

(60) Division of application No. 12/260,373, filed on Oct. 29, 2008, now Pat. No. 7,636,273, which is a division of application No. 11/845,258, filed on Aug. 27, 2007, now Pat. No. 7,457,189, which is a division of application No. 11/490,797, filed on Jul. 21, 2006, now Pat. No. 7,277,356, which is a division of application No. 10/916,156, filed on Aug. 11, 2004, now Pat. No. 7,102,958, which is a continuation-in-part of application No. 10/199,857, filed on Jul. 19, 2002, now Pat. No. 6,834,014.

(30) Foreign Application Priority Data

Jul. 20, 2001 (KR) .......................... 2001-0043789
May 8, 2004 (KR) .............................. 2004-32500

(51) Int. Cl.
*G11C 7/10* (2006.01)

(52) U.S. Cl. ................................................ 365/189.03
(58) Field of Classification Search ............ 365/189.03, 365/189.05
See application file for complete search history.

(56) References Cited

U.S. PATENT DOCUMENTS

| 5,590,086 A | 12/1996 | Park et al. |
| 5,617,367 A | 4/1997 | Holland et al. |

(Continued)

FOREIGN PATENT DOCUMENTS

KR 2003-0008327 1/2003

OTHER PUBLICATIONS

Notice to Submit a Response for Korean Patent Application No. 2003-0008327 mailed on Mar. 27, 2006.

*Primary Examiner*—Tuan T. Nguyen
(74) *Attorney, Agent, or Firm*—Myers Bigel Sibley & Sajovec, P.A.

(57) ABSTRACT

An integrated circuit memory device may include a memory cell array and a plurality of data input/output pins. The plurality of data input/output pins may be configured to receive data from a memory controller to be written to the memory cell array during a data write operation, and the data input/output pins may be further configured to provide data to the memory controller from the memory cell array during a data read operation. A mode register may be configured to store information defining an operational characteristic of the memory device, and the mode register may be configured to be set using the data input/output bus. Related methods, systems, and additional devices are also discussed.

1 Claim, 27 Drawing Sheets

U.S. PATENT DOCUMENTS

| | | | |
|---|---|---|---|
| 5,631,871 A | 5/1997 | Park et al. | |
| 5,652,723 A | 7/1997 | Dosaka et al. | |
| 6,151,648 A | 11/2000 | Haq | |
| 6,157,688 A | 12/2000 | Tamura et al. | |
| 6,282,135 B1 | 8/2001 | Proebsting | |
| 6,301,184 B1 * | 10/2001 | Sasaki et al. | 365/226 |
| 6,343,036 B1 | 1/2002 | Park et al. | |
| 6,356,106 B1 | 3/2002 | Greeff et al. | |
| 6,356,485 B1 | 3/2002 | Proebsting | |
| 6,373,753 B1 | 4/2002 | Proebsting | |
| 6,438,063 B1 | 8/2002 | Lee | |
| 6,493,394 B2 | 12/2002 | Tamura et al. | |
| 6,502,212 B1 | 12/2002 | Coyle et al. | |
| 6,519,173 B2 | 2/2003 | Funaba et al. | |
| 6,665,222 B2 | 12/2003 | Wright et al. | |
| 6,965,964 B2 | 11/2005 | Lee et al. | |
| 7,039,782 B2 | 5/2006 | Garrett et al. | |
| 7,142,461 B2 | 11/2006 | Janzen | |
| 7,155,627 B2 | 12/2006 | Matsui | |
| 2002/0054529 A1 * | 5/2002 | Nishino et al. | 365/219 |
| 2004/0105292 A1 | 6/2004 | Matsui | |
| 2005/0270854 A1 * | 12/2005 | Hyun et al. | 365/189.05 |

\* cited by examiner

FIG. 3B (PRIOR ART)

| SYMBOL | TYPE | DESCRIPTION |
|---|---|---|
| CK, /CK | Input | Clock : CK and /CK are differential clock inputs. All address and control input signals are sampled on the positive edge of CK and negative edge of /CK. Output(read) data is referenced to both edges of CK. Internal clock signals are derived from CK and /CK. |
| CKE | Input | Clock Enable : CKE HIGH activates, and CKE LOW deactivates internal clock signals, and device input buffers and output drivers. |
| /CS | Input | Chip Select : /CS enables (registered LOW) and disables (registered HIGH) the command decoder. All commands are masked when /CS is registerd HIGH. /CS is considered part of the command code. |
| /RAS, /CAS, /WE | Input | Command Inputs : /RAS, /CAS and /WE (along with /CS) define the command being entered. |
| DM | Input | Input Data Mask : DM is an input mask signal for write data. Input data is masked when DM is sampled HIGH along with that input data during a WRITE access. |
| BA0, BA1 | Input | Bank Address Inputs : BA0 and BA1 define to which bank ACTIVE, READ, WRITE or PRECHARGE command is being applied. |
| A[n:0] | Input | Address Inputs : Provides the row address for ACTIVE commands, the column address for READ/WRITE commands to select one location out of the memory array in the respective bank. The address inputs also provide the op-code during a MODE REGISTER SET (MRS) command. BA0 and BA1 define which mode register is loaded during the MODE REGISTER SET command (MRS or Extended MRS (EMRS)). |
| DQ[8:1] | I/O | Data Input/Output : Data bus |
| DQS | I/O | Data Strobe : Output with read data, input with write data. Edge-aligned with read data, centered in write data. Used to capture write data. |
| NC | — | No Connect : No internal electrical connection is present |
| VDDQ | Supply | DQ Power Supply |
| VSSQ | Supply | DQ Ground |
| VDD | Supply | Power Supply |
| VSS | Supply | Ground |

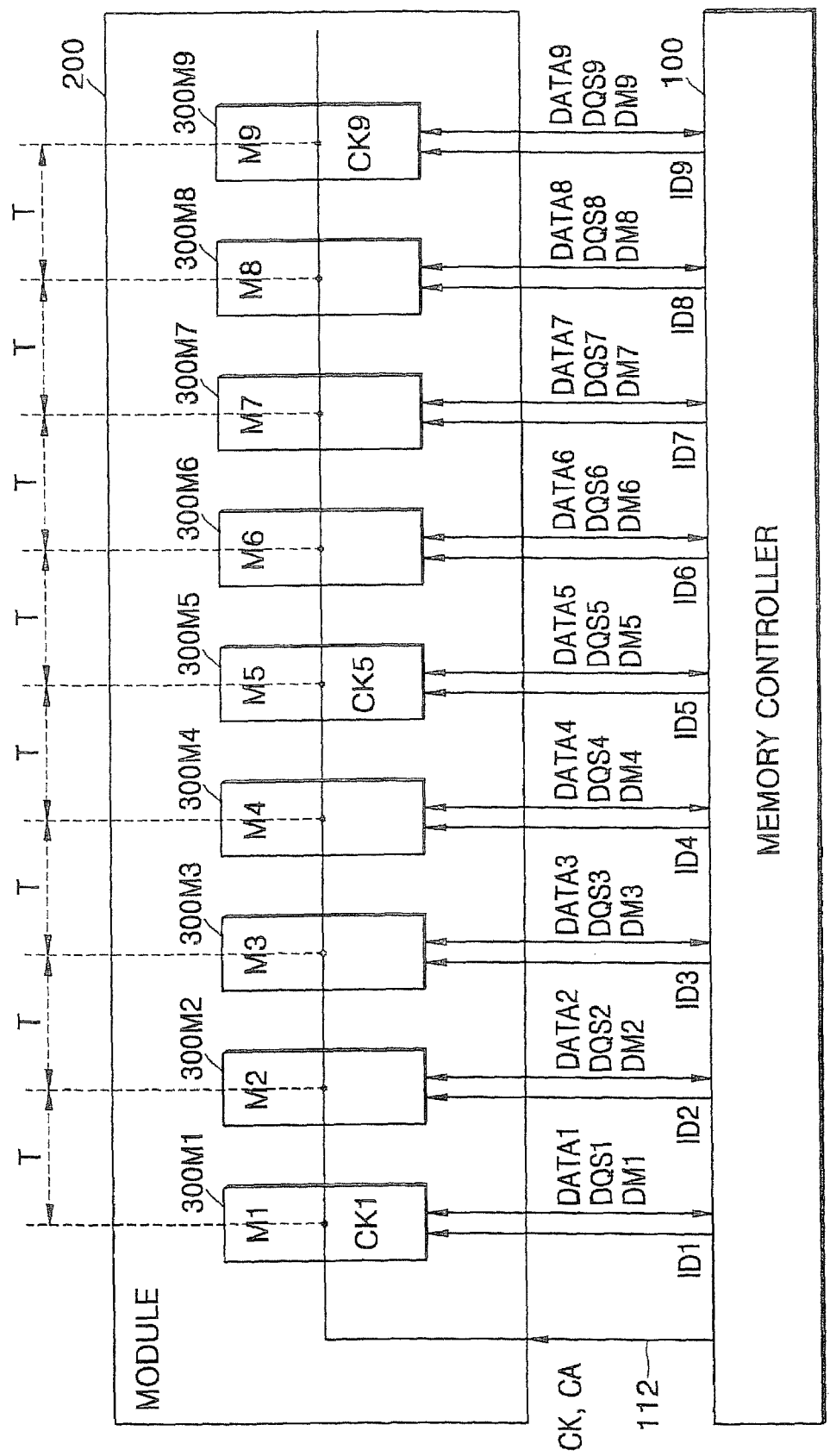

FIG. 9B

| COMMAND | TIMING ADJUSTMENT |
|---------|-------------------|
| MRS1 | +4T |
| MRS2 | +3T |
| MRS3 | +2T |
| MRS4 | +1T |
| MRS5 | 0 |
| MRS6 | −1T |
| MRS7 | −2T |
| MRS8 | −3T |
| MRS9 | −4T |

FIG. 24
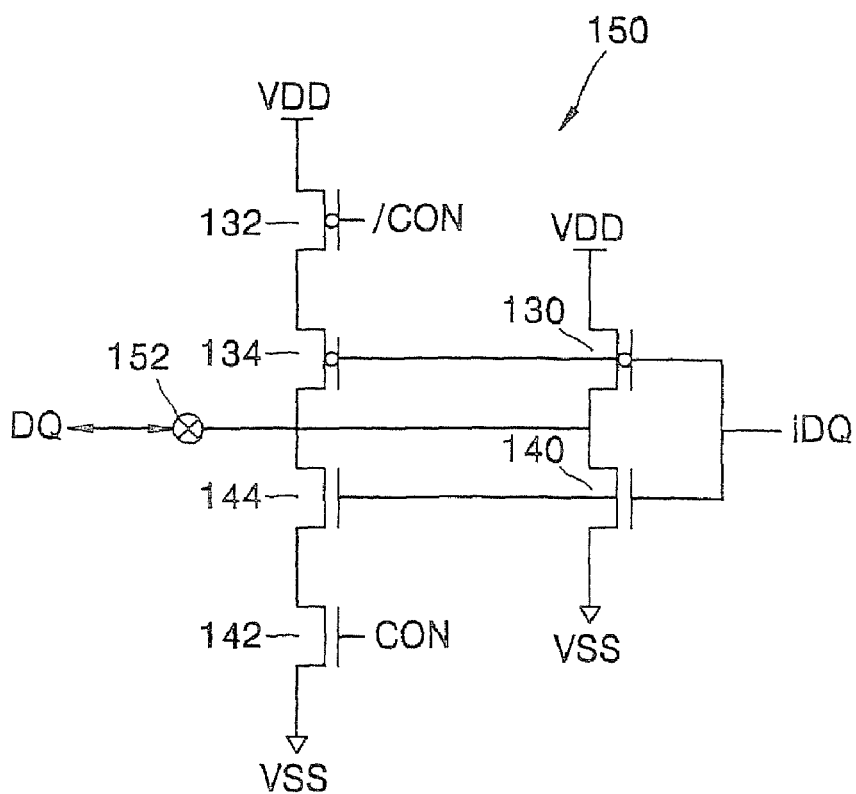
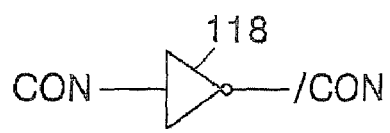
CON(HIGH) → INCREASE THE DRIVER STRENGTH
CON(LOW) → REDUCE THE DRIVER STRENGTH

INTEGRATED CIRCUIT MEMORY DEVICES INCLUDING MODE REGISTERS SET USING A DATA INPUT/OUTPUT BUS

RELATED APPLICATIONS

The present application claims the benefit of priority as a divisional application of U.S. patent application Ser. No. 12/260,373 filed Oct. 29, 2008 now U.S. Pat. No. 7,636,273, which is a divisional application of U.S. patent application Ser. No. 11/845,258 filed Aug. 27, 2007, now issued as U.S. Pat. No. 7,457,189, which is a divisional of U.S. patent application Ser. No. 11/490,797 filed Jul. 21, 2006, now issued as U.S. Pat. No. 7,277,356, which is a divisional application of U.S. patent application Ser. No. 10/916,156 filed Aug. 11, 2004, now issued as U.S. Pat. No. 7,102,958, which is a continuation-in-part (CIP) application of U.S. patent application Ser. No. 10/199,857 filed Jul. 19, 2002, now issued as U.S. Pat. No. 6,834,014, which claims the benefit of priority from Korean Application Number 2001-0043789 filed Jul. 20, 2001. The present application also claims the benefit of priority from Korean Application Number 2004-32500, filed May 8, 2004 (through U.S. patent application Ser. Nos. 11/845,258, 11/490,797 and 10/916,156). The disclosures of U.S. patent application Ser. No. 11/845,258, U.S. patent application Ser. No. 11/490,797, U.S. patent application Ser. No. 10/916,156, U.S. patent application Ser. No. 10/199,857, Korean Application Number 2001-0043789, and Korean Application Number 2004-32500 are hereby incorporated herein in their entirety by reference.

FIELD OF THE INVENTION

The present application relates to the field of electronics and more particularly to electronic memory devices, memory modules, memory controllers, and related methods.

BACKGROUND

In a digital memory system, a memory controller 10 may control operations of a memory module 20 including a plurality of memory devices 30 separately identified as M1-M9. More particularly, each memory device 30 may be an integrated circuit dynamic random access memory device.

Data signals DATA1-DATA9 can be transmitted between the memory controller 10 and the separate memory devices 30 using separate data signal bus lines. During a read operation, data signals DATA1-DATA9 can be read from the memory devices M1-M9 to the memory controller 10 over the separate data bus lines at the same time, and during a write operation, data signals DATA1-DATA9 can be written from the memory controller to the memory devices M1-M9 at the same time. In addition, separate lines for data strobe signals DQS1-DQS9 and separate lines for data mask signals DM1-DM9 are provided between memory controller 10 and each of the memory devices M1-M9. Accordingly, a propagation delay between the memory controller 10 and each of the memory devices M1-M9 may be approximately the same for data signals DATA1-DATA9, data strobe signals DQS1-DQS9, and data mask signals DM1-DM9. The arrangement of FIG. 1 with separate data buses between the memory controller 10 and each of the memory devices M1-M8 may be referred to as providing point-to-point connections.

In contrast, a same control/address/clock bus 12 may couple control/address signals CA and a system clock signal CK from the memory controller 10 to each of the memory devices M1-M9. Accordingly, a length of the transmission line for the clock signal CK may be different for each of the memory devices M1-M9 so that a propagation delay of the clock signal CK may vary for each of the memory devices M1-M9. If the memory devices M1-M9 are evenly spaced along the control/address/clock bus 12, the clock signal CK may experience an incremental propagation delay T (also referred to as a phase difference or phase shift) for each memory device M1-M9 in the module. Arbitrarily assigning a propagation delay of 0 for the first memory device M1, for example, the clock signal CK propagation delay of T may result at second memory device M2, a propagation delay of 2T may result at third memory device M3, a propagation delay of 3T may result at fourth memory device M4, a propagation delay of 4T may result at fifth memory device M5, a propagation delay of 5T may result at sixth memory device M6, a propagation delay of 6T may result at seventh memory device M7, a propagation delay of 7T may result at eighth memory device M8, and a propagation delay of 8T may result at ninth memory device M9. The arrangement of FIG. 1 with the clock signal CK being provided to each of the memory devices M1-M9 is referred to as providing a fly-by clock.

Reading and writing data signals DATA1-DATA9 provided over respective point-to-point data buses may be synchronized with the fly-by system clock signal CK provided to each of the memory devices over a same system clock signal line. At relatively high operating speeds, however, it may be difficult to synchronize transfers of data signals DATA1-DATA9 over the respective point-to-point data buses where the system clock signal CIA is provided to the different memory devices M1-M9 with different propagation delays.

FIG. 2 illustrates the memory module 20 including nine memory devices 30 separately identified as M1-M9. As shown, each memory device 30 includes eight data pins PDQ1-PDQ8, a data mask pin PDM, and a data strobe pin PDQS separately connected to the memory controller. As shown, data signals DQ1-8 (i.e. DATA1) are provided to/from data pins PDQ1-PDQ8 of memory device M1; data signals DQ9-DQI6 (i.e. DATA2) are provided to/from data pins PDQ1-PDQ8 of memory device M2; data signals DQ17-DQ24 (i.e. DATA3) are provided to/from data pins PDQ1-PDQ8 of memory device M3; data signals DQ25-DQ32 (i.e. DATA4) are provided to/from data pins PDQ1-PDQ8 of memory device M4; data signals DQ33-DQ40 (i.e. DATA5) are provided to/from data pins PDQ1-PDQ8 of memory device M5; data signals DQ41-DQ48 (i.e. DATA6) are provided to/from data pins PDQ1-PDQ8 of memory device M6; data signals DQ49-DQ56 (i.e. DATA7) are provided to/from data pins PDQ1-PDQ8 of memory device M7; data signals DQ57-DQ64 (i.e. DATA8) are provided to/from data pins PDQ1-PDQ8 of memory device M8; and data signals DQ65-DQ726 (i.e. DATA2) are provided to/from data pins PDQ1-PDQ8 of memory device M9. Data mask signals DM1-DM9 are provided to respective data mask pins PDM of each memory device M1-M9 through separate data mask lines, and data strobe signals DQS1-DQS9 are provided to respective data strobe pins PDQS of each memory device M1-M9 through separate data strobe lines.

As used herein, the term pin is defined to include any input or output structure of an integrated circuit memory device providing electrical connectivity to another device, substrate, and/or circuit board. For example, the term pin may include: leads of a dual in-line package (DIP), a single in-line package (SIP), a pin grid array (PGA), quad small outline package (QSOP), etc.; solder bumps of a flip-chip, ball grid array, etc.; wire bonds; bonding pads; etc.

Moreover, each memory device M1-M9 includes a plurality of clock/command/address pins PCA coupled to a same clock/command/address bus 12. The system clock signal CK and the command/address signals CA are provided to the clock/command/address pins of memory devices M1-M9 over the clock/command/address bus 12. The address signals transmitted over the clock/command/address bus 12 define memory locations of the memory devices M1-M9 to which or from which data signals DATA1-DATA9 should be written or read. More particularly, the address signals may define bank addresses and row/column addresses. A memory device, for example, may include four banks of memory cells, and each memory bank may operate with selected row and column addresses independently.

The command signals transmitted over the cloclk/command/address bus 12 define operations to be performed by the memory devices M1-M9. Command signals may define commands such as a row active command (ACTIVE), a read command (READ), a write command (WRITE), a refresh command (REF), a power down command (PWDN), a mode register set command (MRS), etc. Command pins may include a clock enable pin, a chip select pin, a row address strobe pin, a column address strobe pin, and a write enable pin. FIG. 3A is a diagram illustrating pins of a integrated circuit dynamic random access memory device, and FIG. 3B is a table describing pin functionalities of the memory device of FIG. 3A.

FIG. 4 is a block diagram illustrating functional blocks of a memory device. As shown, the memory device 30 includes command decoder 34, address buffer 35, internal clock generator 36, data I/O buffer 37, row decoder 32, column decoder 33, memory cell array 31, and sense amplifier 38. As shown, command signals CMD of the clock/command/address signals CA are provided to the command decoder 34, address signals ADD of the clock/command/address signals CA are provided to the address buffer 35, and the system clock signal CK of the clock/command/address signals CA is provided to the internal clock generator 36. The internal clock generator 36 generates an internal clock signal iCLK responsive to the system clock signal CK.

Accordingly, the command decoder 34 decodes the command signals CMD to determine a particular operation (such as a read operation, a write operation, or a mode register set operation) to be performed. During a mode register set operation, a value is written to a mode register to define a mode of operation for the memory device. During a write operation, data signals DATA from the memory controller are received at the data I/O buffer 37 and written as iDATA to locations of the memory cell array 31 defined by address signals ADD received from the memory controller. During a read operation, iDATA from locations of the memory cell array defined by address signals ADD received from the memory controller is retrieved by the data I/O buffer 37 and provided as data signals DATA to the memory controller. As shown in FIG. 4, the data I/O buffer 37 operates responsive to the iCLK signal generated by the internal clock generator 36.

FIG. 5 is a timing diagram illustrating a read operation of the memory module 20 including a plurality of memory devices 30, where the read operation is initiated responsive to a read command READ received over the clock/command/address data bus 12. Due to different propagation delays along the clock/command/address bus 12, the system clock signal CK may be shifted in phase at each of the memory devices M1-M9. In FIG. 5, signal CK1 is the system clock signal CK as received at memory device M1, signal CK5 is the system clock signal CK as received at memory device M5, and signal CK9 is the system clock signal CK as received at memory device M9. The internal clock signal iCLK5 of memory device M5 is thus delayed by an interval of 4T relative to the internal clock signal iCLK1 of memory device M1, and the internal clock signal iCLK9 of memory device M9 is delayed by an interval of 4T relative to the internal clock signal iCLK5 of memory device M5. Because the internal clock signals are not synchronized and because the data I/O buffers of the memory devices operate responsive to the respective internal clock signals, the data signals DATA1-DATA9 will be provided out of the respective memory devices at different times resulting in data skew. As shown in FIG. 5, the data signals DATA9 out of the memory device M9 are thus delayed by an interval 4T relative to the data signals DATA5 out of the memory device M5, and the data signals DATA5 out of memory device M5 are delayed by an interval 4T relative to the data signals DATA1 out of memory device M1. The data skew may limit an operating speed of the memory module during a write operation.

FIG. 6 is a timing diagram illustrating a write operation of the memory module 20 including a plurality of memory devices 30, where the write operation is initiated responsive to a write command WRITE received over the clock/command/address data bus 12. Due to different propagation delays along the clock/command/address bus 12, the system clock signal CK may be shifted in phase at each of the memory devices M1-M9. In FIG. 6, signal CK1 is the system clock signal CK as received at memory device M1, signal CK5 is the system clock signal CK as received at memory device M5, and signal CK9 is the system clock signal CK as received at memory device M9. The internal clock signal iCLK5 of memory device M5 is thus delayed by an interval of 4T relative to the internal clock signal iCLK1 of memory device M1, and the internal clock signal iCLK9 of memory device M9 is delayed by an interval of 4T relative to the internal clock signal iCLK5 of memory device M5. Because the internal clock signals are not synchronized and because the data I/O buffers of the memory devices operate responsive to the respective internal clock signals, the external data signals DATA1-DATA9 will be provided by the memory controller at the same time, but the internal data signals iDATA1-iDATA9 will be generated by the respective data input/output buffers at different times resulting in data skew. As shown in FIG. 6, the internal data signals iDATA9 for the memory device M9 are thus delayed by an interval 4T relative to the internal data signals iDATA5 for the memory device M5, and the internal data signals iDATA5 for the memory device M5 are delayed by an interval 4T relative to the internal data signals iDATA1 for memory device M1. The data skew may limit an operating speed of the memory module during a write operation.

SUMMARY

According to embodiments of the present invention, a memory system may include a command/address bus having a plurality of command/address lines, first and second integrated circuit memory devices, and a memory controller. The first integrated circuit memory device may include a first plurality of command/address pins coupled to the command/address lines of the command/address bus, a first mode register configured to store information defining an operational characteristic of the first memory device, and a first command decoder. The command decoder may be configured to accept a mode register set command responsive to an enable signal received on a first predetermined pin of the first integrated circuit memory device and to reject a mode register set command responsive to a disable signal received on the first predetermined pin. Accordingly, information of a mode register set command may be saved to the first mode register when the enable signal is received on the first predetermined pin during a mode register set operation.

Similarly, the second integrated circuit memory device may include a second plurality of command/address pins coupled to the command/address lines of the command/address bus, a second mode register configured to store information defining an operational characteristic of the second memory device, and a second command decoder. The second command decoder may be configured to accept a mode register set command responsive to an enable signal received on a second predetermined pin of the second integrated circuit memory device and to reject a mode register set command responsive to a disable signal received on the second predetermined pin. Accordingly, information of a mode register set command may be saved to the second mode register when the enable signal is received on the second predetermined pin during a mode register set operation.

The memory controller may be coupled to the command/address bus wherein the memory controller is configured to transmit a first mode register set command over the command/address bus to the first and second pluralities of command/address pins of the first and second integrated circuit memory devices during a first mode register set operation. The memory controller may be further configured to transmit a first enable signal to the first predetermined pin of the first integrated circuit memory device and to transmit a first disable signal to the second predetermined pin of the second integrated circuit memory device during the first mode register set operation.

According to additional embodiments of the present invention, methods may be provided for controlling a memory module including a plurality of memory devices coupled to a memory controller over a same command/address bus. More particularly, a mode register set command may be provided from the memory controller to each of the integrated circuit memory devices over the command/address bus during a mode register set operation. A disable signal may be provided from the memory controller to a first one of the integrated circuit memory devices over a signal line between the memory controller and the first integrated circuit memory device to thereby disable implementation of the mode register set command for the first integrated circuit memory device during the mode register set operation. An enable signal may be provided from the memory controller to a second one of the integrated circuit memory devices over a signal line between the memory controller and the second integrated circuit memory device to thereby enable implementation of the mode register set command for the second integrated circuit memory device during the mode register set operation. Moreover, the disable signal may not be provided to the second integrated circuit memory device during the mode register set operation, and the enable signal may not be provided to the first integrated circuit memory device during the mode register set operation.

According to still additional embodiments of the present invention an integrated circuit memory device may include a memory cell array, a mode register, a command decoder, and a data input/output buffer. The mode register may be configured to store information defining an operational characteristic of the memory device. The command decoder may be configured to accept a selective mode register set command responsive to an enable signal received on a predetermined pin of the integrated circuit memory device. The command decoder may be further configured to reject a selective mode register set command responsive to a disable signal received on the predetermined pin of the integrated circuit memory device during a selective mode register set operation. Accordingly, information of the selective mode register set command may be saved to the mode register when the enable signal is received on the predetermined pin during the selective mode register set operation. The data input/output buffer may be configured to control writing of data to the memory cell array during a write operation and to control reading of data from the memory cell array during a read operation in accordance with the operational characteristic defined by the information saved in the mode register.

According to yet additional embodiments of the present invention, methods of operating an integrated circuit memory device may include accepting a first selective mode register set command responsive to an enable signal having a first logic value received on a predetermined pin of the integrated circuit memory device during a first selective mode register set operation so that information corresponding to the first selective mode register set command is saved to a mode register. A second selective mode register set command may be rejected responsive to a disable signal having a second logic value received on the predetermined pin of the integrated circuit memory device during a second selective mode register set operation so that information corresponding to the second selective mode register set command is not saved to the mode register. Moreover, the first and second logic values may be opposite logic values. Writing of data to a memory cell array of the integrated circuit memory device may be controlled during a write operation and/or reading of data from the memory cell array may be controlled during a read operation in accordance with an operational characteristic defined by information saved in the mode register.

According to more embodiments of the present invention methods may be provide for operating a memory module including a plurality of integrated circuit memory devices. The plurality of memory devices may be coupled to a memory controller over a same command/address bus, and the plurality of memory devices may be separately coupled to the memory controller through respective data input/output buses. More particularly, a mode register of a first one of the memory devices may be set using a first data input/output bus coupled between the memory controller and the first memory device thereby defining an operational characteristic of the first memory device. A mode register of a second one of the memory devices may be set using a second data input/output bus coupled between the memory controller and the second memory device thereby defining an operational characteristic of the second memory device. In addition, first data signals may be written to a memory cell array of the first memory device over the first data input/output bus, and second data signals may be written to a memory cell array of the second memory device over the second data input/output bus.

According to still more embodiments of the present invention, an integrated circuit memory device may include a memory cell array, a plurality of data input/output pins, and a mode register. The plurality of data input/output pins may be configured to receive data from a memory controller to be written to the memory cell array during a data write operation, and the data input/output pins may be further configured to provide data to the memory controller from the memory cell array during a data read operation. The mode register may be configured to store information defining an operational characteristic of the memory device, and the mode register may be configured to be set using the data input/output bus.

According to further embodiments of the present invention, methods may be provided for operating a memory module including a plurality of memory devices coupled to a memory controller over a same command/address bus. More particularly, a mode register set command may be received from the memory controller at each of the integrated circuit memory devices over the command/address bus during a mode register set operation. A disable signal may be received from the memory controller at a first one of the integrated circuit memory devices over a signal line between the memory controller and the first integrated circuit memory device to thereby disable implementation of the mode register set command for the first integrated circuit memory device during the mode register set operation. An enable signal may be received from the memory controller at a second one of the integrated circuit memory devices over a signal line between the memory controller and the second integrated circuit memory device to thereby enable implementation of the mode register set command for the second integrated circuit memory device during the mode register set operation. Moreover, the disable signal may not be received at the second integrated circuit memory device during the mode register set operation, and the enable signal may not be received at the first integrated circuit memory device during the mode register set operation.

BRIEF DESCRIPTION OF THE DRAWINGS

FIG. 3B is a table defining pin labels for the conventional memory device of FIG. 3A.

FIG. 7 is a block diagram illustrating memory systems including a memory modules and a memory controllers according to embodiments of the present invention.

FIG. 9B is a table illustrating mode register set commands for internal clock signal timing adjustment according to embodiments of the present invention.

FIG. 24 is a schematic diagram illustrating output drivers according to embodiments of the present invention.

DETAILED DESCRIPTION

Figure 1:
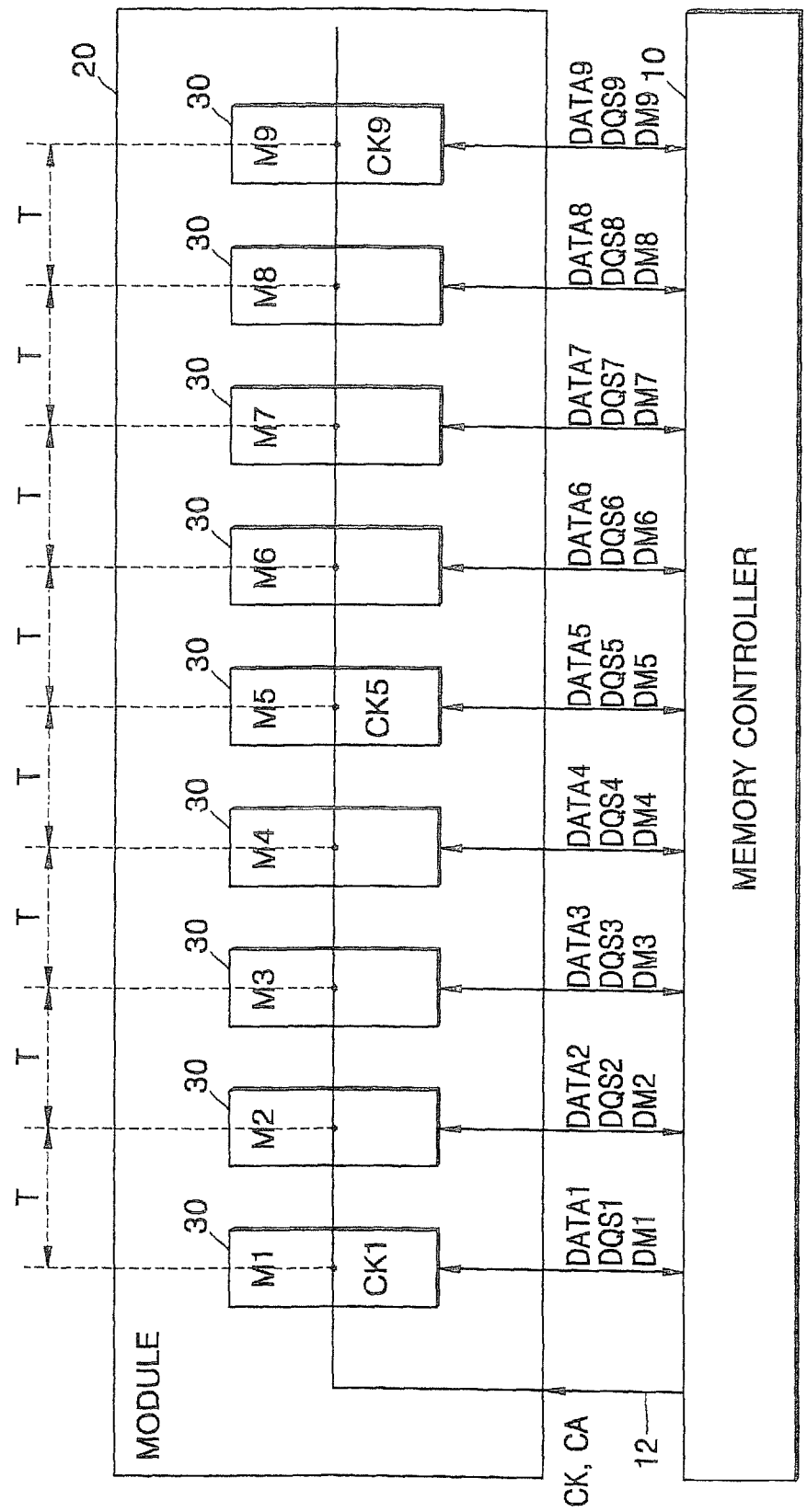
FIG. 1 is a block diagram illustrating a conventional memory system including a memory module and a memory controller.
Figure 2:
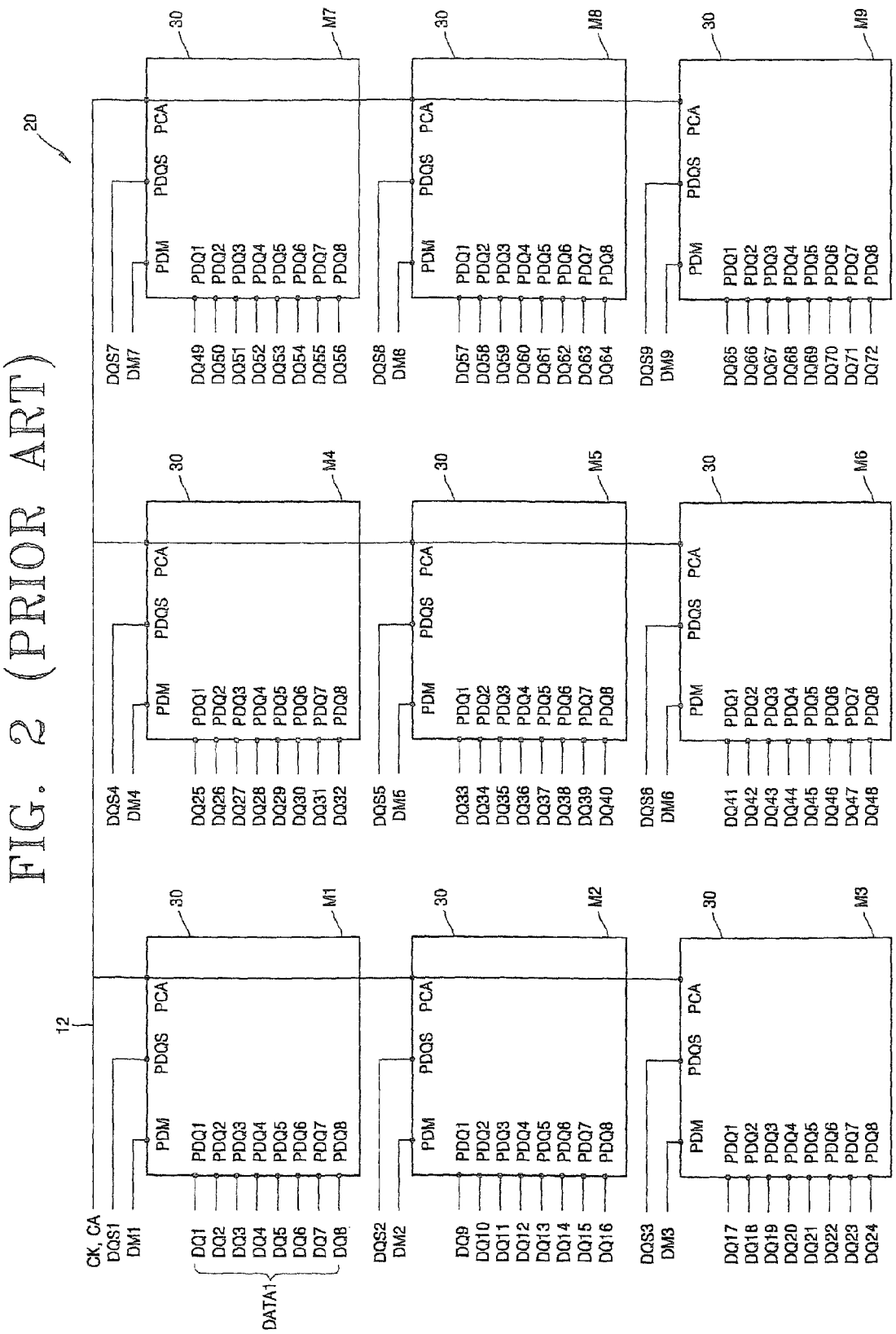
FIG. 2 is a block diagram illustrating memory devices of a conventional memory module.
Figure 3A:
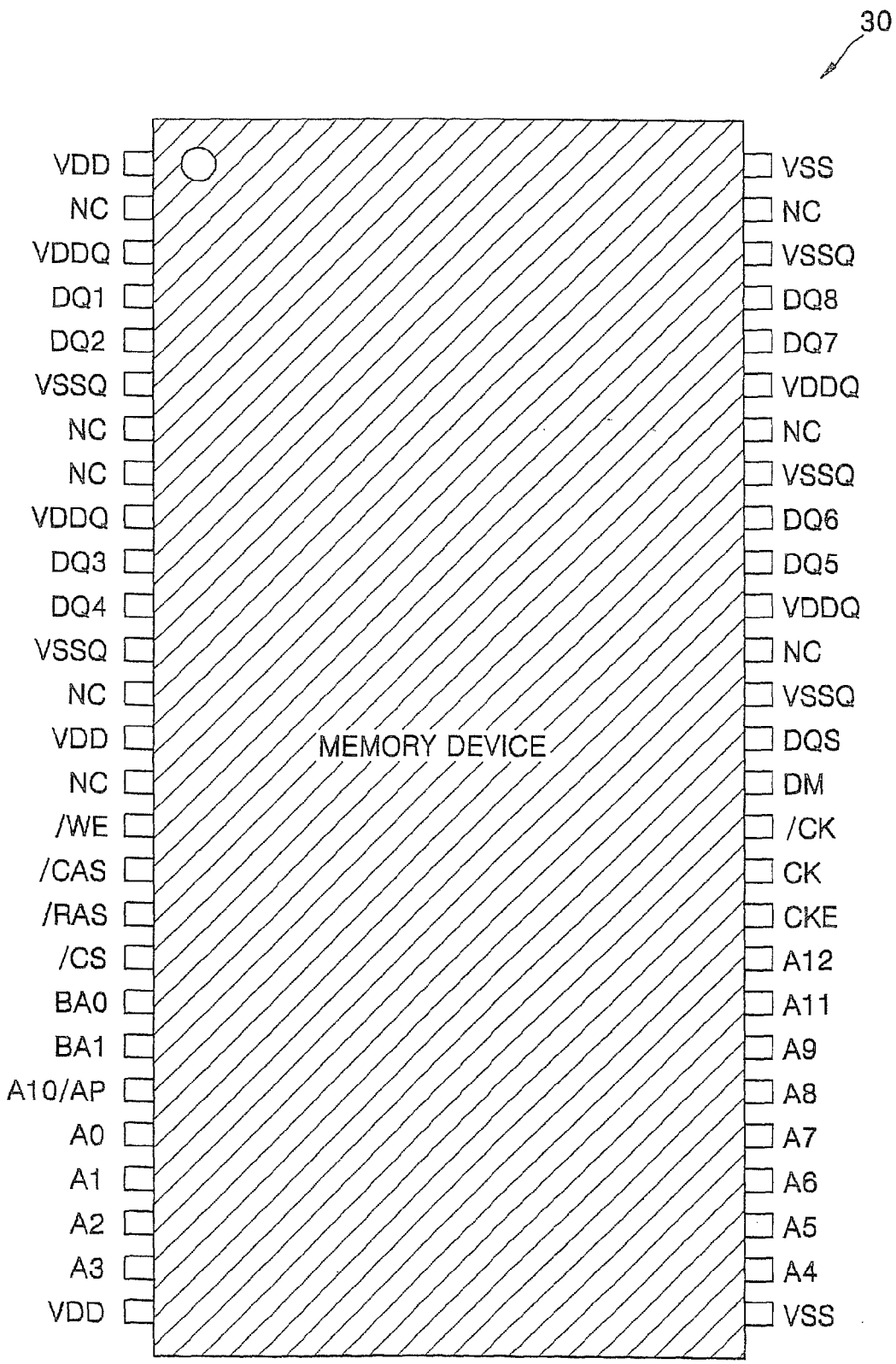
FIG. 3A is a diagram illustrating a pin configuration of a conventional memory device.
Figure 4:
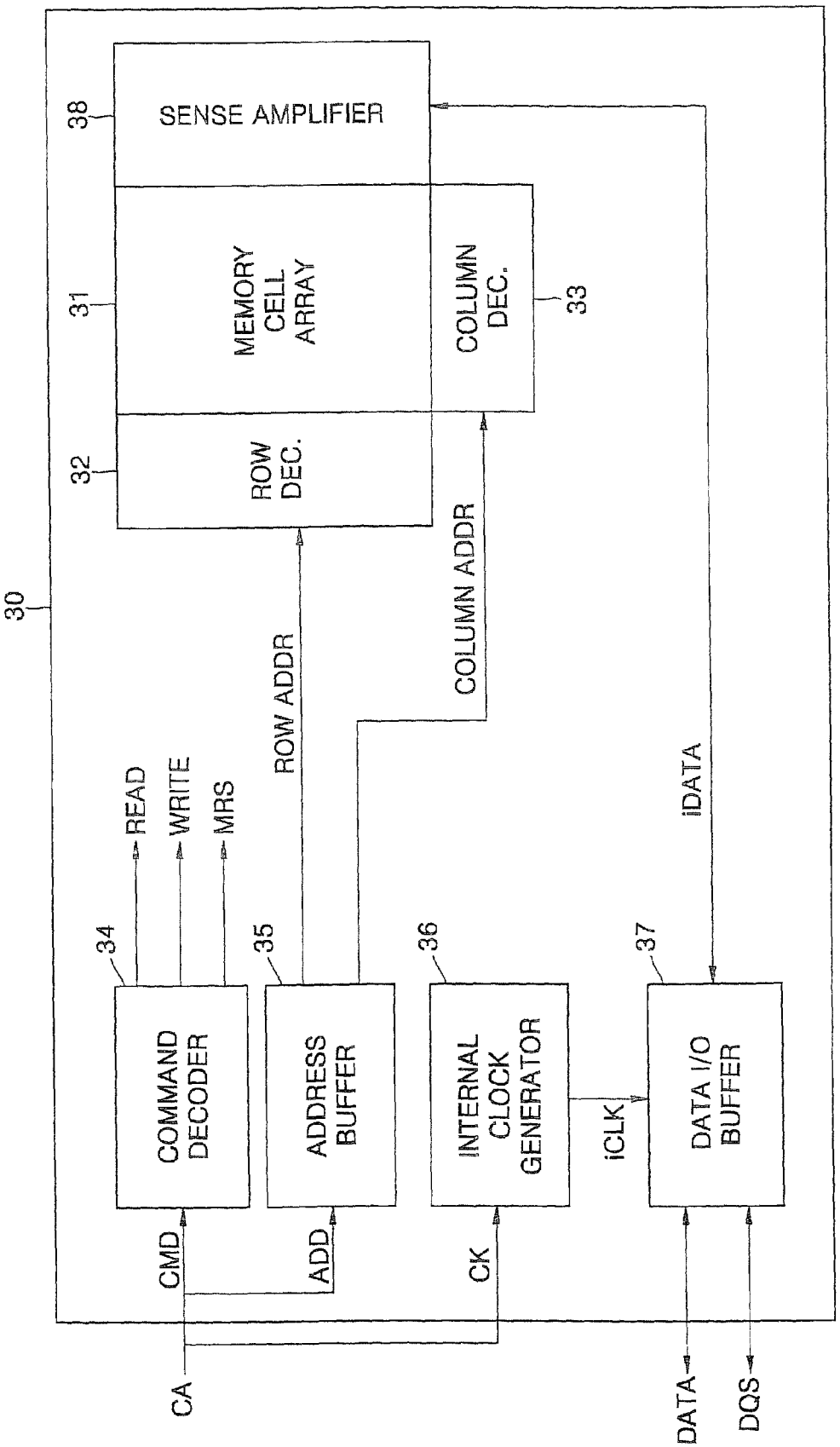
FIG. 4 is a block diagram illustrating a conventional memory device.
Figure 5:
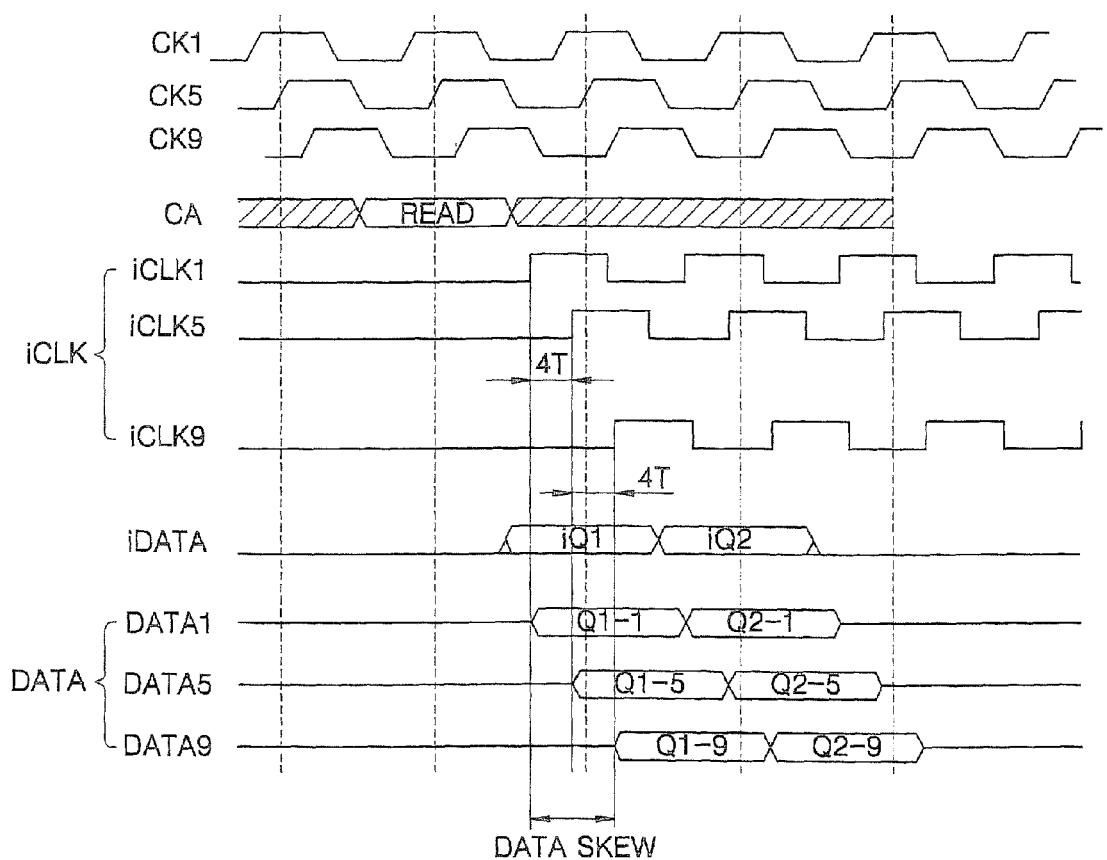
FIG. 5 is a timing diagram illustrating a read operation of a conventional memory system.
Figure 6:
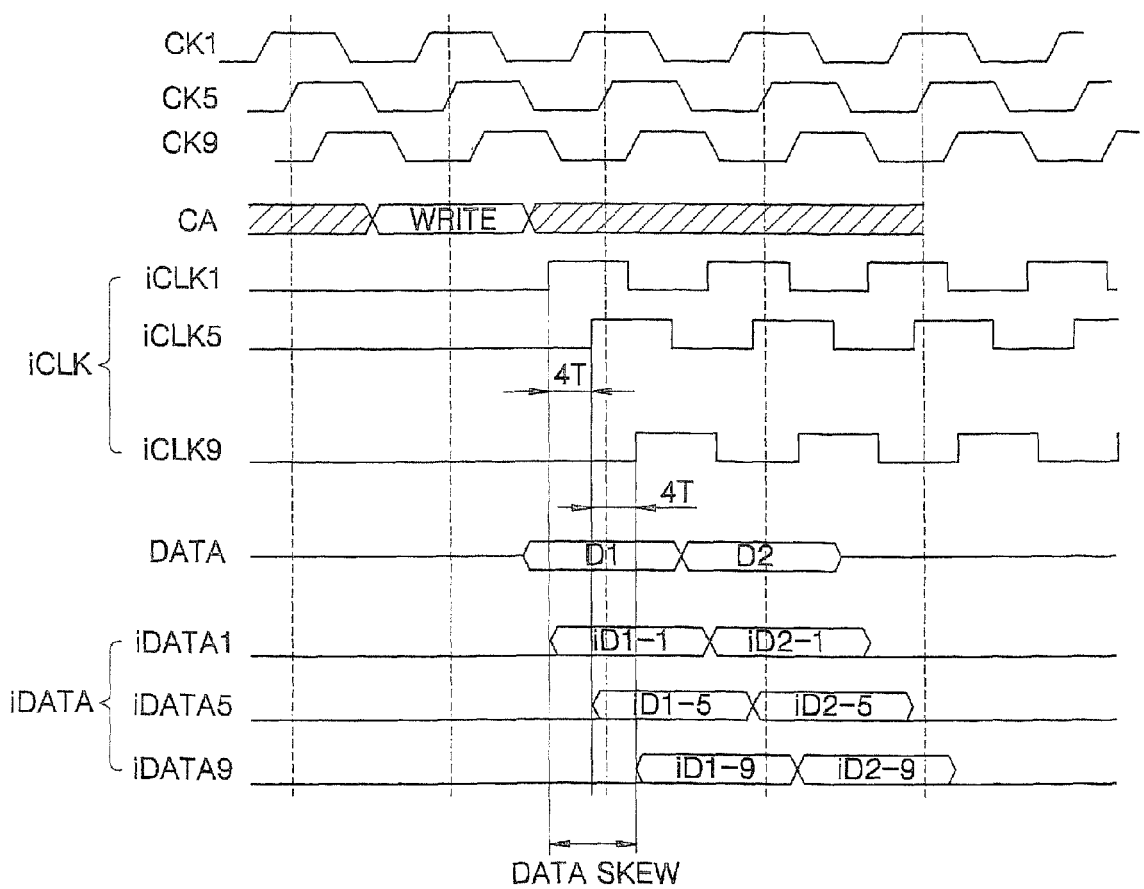
FIG. 6 is a timing diagram illustrating a write operation of a conventional memory system.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In a digital memory system according to embodiments of the present invention illustrated in FIG. 7, a memory controller 100 may control operations of a memory module 200 including a plurality of memory devices 300M1-300M9. More particularly, each memory device 300 may be an integrated circuit dynamic random access memory device.

Data signals DATA1-DATA9 can be transmitted between the memory controller 100 and the separate memory devices 300M1-300M9 using separate data signal bus lines. During a read operation, data signals DATA1-DATA9 can be read from memory devices 300M1-300M9 to the memory controller 100 over separate data bus lines at the same time, and during a write operation, data signals data signals DATA1-DATA9 can be written from the memory controller 100 to the memory devices 300M1-300M9 at the same time. In addition, separate lines for data strobe signals DQS1-DQS9 and separate lines for data mask signals DM1-DM9 are provided between the memory controller 100 and each of the memory devices 300M1-300M9.

Moreover, separate lines for mode register set enable/disable signals ID1-ID9 are provided between the memory controller 100 and each of the memory devices 300M1-300M2. For example, separate dedicated lines may be provided between the memory controller and dedicated mode register set enable/disable pins on each of the memory devices. In an alternative, lines used to transmit the data strobe signals DQS1-DQS9 during read/write operations, lines used to transmit data signals DATA1-DATA9 during read/write operations, or lines used to transmit the data mask signals DM1-DM9 during read/write operations may be used to separately transmit the mode register set enable/disable signals ID1-ID9 to each of the memory devices 300M1-300M9 during mode register set operations.

Accordingly, a propagation delay between the memory controller 100 and each of the memory devices 300M1-300M9 may be approximately the same for data signals DATA1-DATA9, for data strobe signals DQS10-DQS9, for data mask signals DM1-DM9, and for mode register set enable/disable signals ID1-ID9. The arrangement of FIG. 1 with separate data buses between the memory controller 100 and each of the memory devices 300M1-300M9 may be referred to as providing point-to-point connections.

In contrast, a clock/command/address bus 112 may couple control/address signals CA and a system clock signal CK from the memory controller 100 to each of the memory devices 300M1-300M9. Accordingly, a length of the transmission line for the clock signal CK may be different for each of the memory devices 300M1-300M2 so that a propagation delay of the clock signal CK may vary for each of the memory devices 300M1-300M9. If the memory devices 300M1-300M9 are evenly spaced along the control/address/clock bus 112, the clock signal CK may experience an incremental propagation delay T (also referred to as a phase difference or phase shift) for each memory device 300M1-300M9 in the memory module 200. Arbitrarily assigning a propagation delay of 0 for the first memory device 300M1, for example, the clock signal CK propagation delay of T may result at second memory device 300M2, a propagation delay of 2T may result at memory device 300M3, a propagation delay of 3T may result at memory device 300M4, a propagation delay of 4T may result at memory device 300M5, a propagation delay of 5T may result at memory device 300M6, a propagation delay of 6T may result at memory device 300M7, a propagation delay of 7T may result at memory device 300M8, and a propagation delay of 8T may result at memory device 300M9. The arrangement of FIG. 7 with the clock signal CK being provided to each of the memory devices 300M1-300M9 may be referred to as providing a fly-by clock.

Reading and writing data signals DATA1-DATA9 provided over respective point-to-point data buses may be synchronized using the fly-by system clock signal CK provided to each of the memory devices 300M1-300M9 over a same system clock signal line of the clock/command/address bus 112. According to embodiments of the present invention, however, each of the memory devices 300M1-300M9 may include an internal clock signal generator configured to adjust a timing of the internal clock signal so that the internal clock signals of the different memory devices 300M1-300M9 may be approximately synchronized even though the system clock signal is received at the different memory devices with different propagation delays. More particularly, the timing of each internal clock signal may be adjusted relative to the system clock signal CIK as received at the respective memory device responsive to a value stored in a mode register of the memory device. Accordingly, mode registers of different memory devices may be programmed with different values to compensate for differences in the propagation delays of the system clock signal CK received at the different memory devices.

The mode register set enable/disable signals ID1-ID9, for example, may be used to enable or disable individual ones of the memory devices 300M1-300M9 during a selective mode register set operation when a same mode register set command is applied to all of the memory devices 300M1-300M9 over address lines of the clock/command/address bus 112. For example, during a first selective mode register set operation, an enabling mode register set enable/disable signal ID1 may be applied to memory device 300M1, and disabling mode register set enable/disable signals ID2-ID9 may be applied to memory devices 300M2-300M9. During a second selective mode register set operation, an enabling mode register set enable/disable signal ID2 may be applied to memory device 300M2, and disabling mode register set enable/disable signals ID1 and ID3-ID9 may be applied to memory devices 300M1 and 300M3-300M9. During a third selective mode register set operation, an enabling mode register set enable/disable signal ID3 may be applied to memory device 300M3, and disabling mode register set enable/disable signals ID1-ID2 and ID4-ID9 may be applied to memory devices 300M1-300M2 and 300M4-300M9. During a fourth selective mode register set operation, an enabling mode register set enable/disable signal ID4 may be applied to memory device 300M4, and disabling mode register set enable/disable signals ID1-ID3 and ID5-ID9 may be applied to memory devices 300M1-300M3 and 300M5-300M9. During a fifth selective mode register set operation, an enabling mode register set enable/disable signal ID5 may be applied to memory device 300M5, and disabling mode register set enable/disable signals ID1-ID4 and ID6-ID9 may be applied to memory devices 300M1-300M4 and 300M6-300M9. During a sixth selective mode register set operation, an enabling mode register set enable/ disable signal ID6 may be applied to memory device 300M6, and disabling mode register set enable/disable signals ID1-ID5 and ID7-ID9 may be applied to memory devices 300M1-300M5 and 300M7-300M9. During a seventh selective mode register set operation, an enabling mode register set enable/disable signal ID7 may be applied to memory device 300M7, and disabling mode register set enable/disable signals ID1-ID6 and ID8-ID9 may be applied to memory devices 300M1-300M6 and 300M8-300M9. During an eighth selective mode register set operation, an enabling mode register set enable/disable signal ID8 may be applied to memory device 300M8, and disabling mode register set enable/disable signals ID1-ID7 and ID9 may be applied to memory devices 300M1-300M7 and 300M9. During a ninth selective mode register set operation, an enabling mode register set enable/disable signal ID9 may be applied to memory device 300M9, and disabling mode register set enable/disable signals ID1-ID8 may be applied to memory devices 300M1-300M8.

Accordingly, a series of nine selective mode register set operations may be used to program nine different memory devices for different modes of operations. For example, different ones of the memory devices 300M1-300M9 may be programmed to provide different timing adjustments of the respective internal clock signals relative to the system clock signal CK received at the respective memory devices. Internal clock signals of the different memory devices may thus be approximately synchronized despite different propagation delays for the system clock signal CK received at the respective memory devices. In an alternative or in addition, different ones of the memory devices 300M1-300M9 may be programmed to provide different driver output characteristics (such as driver strengths) for data signals DATA1-DATA9 read by the memory controller 100. In another alternative or in addition, different ones of the memory devices 300M1-300M9 may be programmed to provide different set up and/or hold characteristics for data signals DATA1-DATA9 being written to the respective memory devices. If a plurality of the memory devices 300M1-300M9 are to be programmed to provide a same characteristic (such as a same driver strength), an enabling mode register set enable/disable signal may be applied to the plurality of the memory devices during a same selective mode register set operation.

Figure 8A:
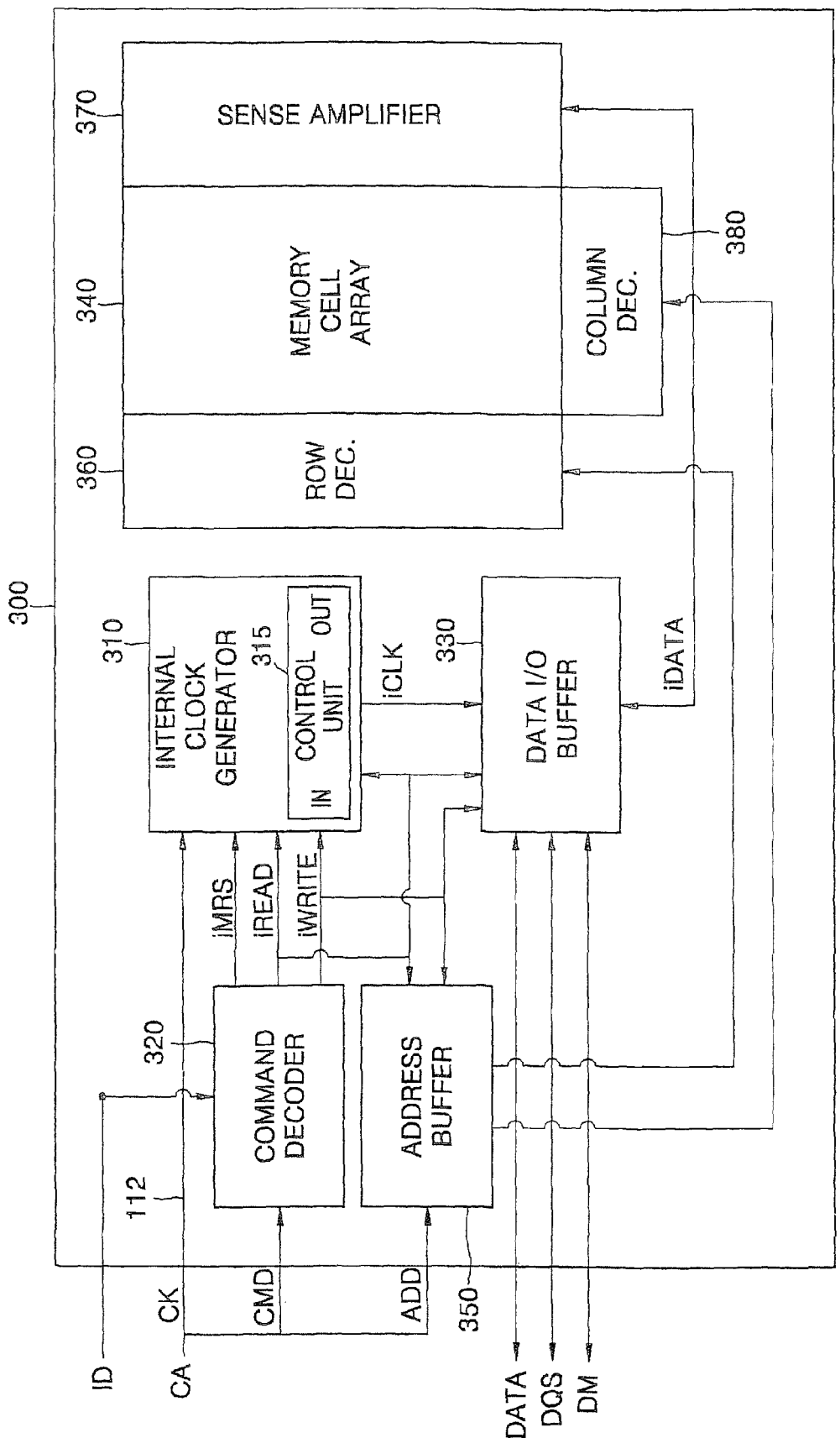
FIG. 8A is a block diagram illustrating a memory devices according to embodiments of the present invention.

As shown in FIG. 8A, a memory device 300 according to embodiments of the present invention may include internal clock signal generator 310 having timing control unit 315, command decoder 320, data input/output (I/O) buffer 330, memory cell array 340, address buffer 350, row decoder 360, column decoder 380, and sense amplifier 370. As discussed above, system clock signal CK, command signals CMD, and address signals ADD may be provided over lines of the clock/command/address bus 112 to clock/command/address pins of the memory device 300. The system clock signal CK may be provided over a dedicated line of bus 112 to a dedicated pin of the memory device 300. Command signals CMD such as a chip select (/CS) signal, a row address strobe (/RAS) signal, a column address strobe (/CAS) signal, and a write enable (/WE) signal may be provided over dedicated lines of the bus 112 to dedicated pins of the memory device 300 and to the command decoder 320. Address signals ADD (including column address signals, row address signals, and/or bank address signals) may be provided over address lines of the bus 112 to the address buffer during read and/or write operations. During mode register set operations, however, a mode register set command may be provided over address lines of the bus 112. As discussed above, lines of the address bus 112 may be connected to a plurality of memory devices in a memory module.

Lines of a data bus may be connected only between a memory controller and the memory device 300. More particularly, data signals DATA, a data strobe signal DQS, and a data mask signal DM may be provided over lines of the data bus to respective data input/output, data strobe, and data mask pins during read and/or write operations. The mode register set enable/disable signal ID, for example, may be provided to a dedicated mode register set enable/disable pin of the memory device 300 during a mode register set operation, and the dedicated pin may be non-functional during read and write operations. In an alternative, the mode register set enable/disable signal ID may be provided to one of the data input/output, data strobe, or data mask pins during a mode register set operation.

During a read operation, data is read from memory cells of the memory cell array 340 identified by address signals ADD provided through address buffer 350. More particularly, data from addresses identified by the row decoder 360 and column decoder 380 is read by sense amplifier 370 and provided to the data I/O buffer 330 as internal data signals iDATA. The buffer 330 provides data signals DATA corresponding to internal data signals iDATA, and the data signals DATA are provided in synchronization with the internal clock signal iCLK generated by the internal clock generator 310.

During a write operation, data signals DATA are provided from the memory controller to data input/output pins of the memory device 300 and latched in the data input/output buffer 330 in synchronization with the internal clock signal iCLK. The data signals DATA in the buffer 330 are then provided as internal data signals iDATA to the memory cell array 340. Address signals ADD received at the address buffer 350 through address pins of the memory device 300 define locations of memory cells of the memory cell array 340 to which the internal data signals iDATA are to be written.

A mode register set operation may be initiated by providing command signals CMD corresponding to a mode register set operation. For example, the chip select signal (/CS), the row address strobe signal (/RAS), the column address strobe signal (/CAS), and the write enable signal (/WE) may all be provided as low signals over the clock/command/address bus 112 to the command decoder 320 to initiate a mode register set operation. Once a mode register set operation is initiated, a mode register set command is provided over address lines of the clock/command/address bus 112 to address pins and the address buffer 350. Because a mode register set operation has been initiated, the signals received over the address lines are treated as a mode register set command as opposed to a memory address.

Figure 8B:
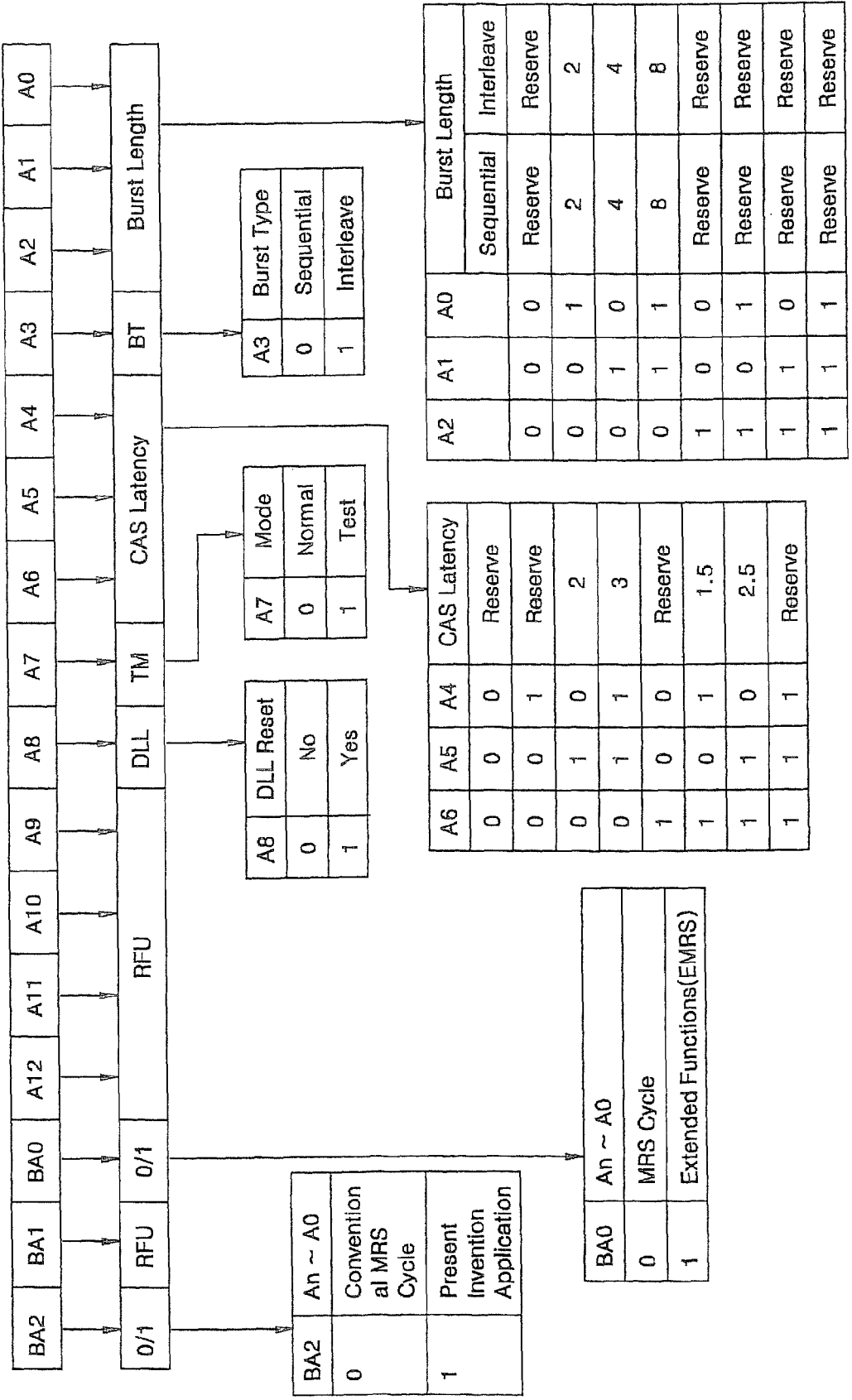
FIG. 8B is a table illustrating mode register set commands according to embodiments of the present invention.

Signals provided to address pins may define various mode register set commands as illustrated in the table of FIG. 8B. Bank address pin BA2, for example, may be used to distinguish a convention mode register set operation (logic value "0") from selective mode register set operations according to embodiments of the present invention where the selective mode register set operation is enabled or disabled depending on the logic value of the mode register set enable/disable signal ID. If a conventional mode register set operation is selected (by providing a logic value of 0 at bank address pin BA2), the bank address pin BA1 may be reserved for future use (RFU), a mode register set (MRS) cycle may be selected by providing a logic value of 0 at bank address pin BA0, and an extended functions mode register set (EMRS) cycle may be selected by providing a logic value of 1 at bank address pin BA0. In an MRS cycle, address pins A9-A12 may be reserved for future use (RFU), address pin A8 may accept a delay locked loop (DLL) reset command, address pin A7 may accept a test mode (TM) command, address pins A4-A6 may accept a CAS latency command, address pin A3 may accept a burst type (BT) command, and address pins A0-A3 may accept a burst length command. Conventional MRS and EMRS cycles may be provided by a memory controller over address lines of a clock/command/address bus 112 to a plurality of memory devices on a memory module. Moreover, the plurality of memory devices connected to the clock/command/address bus 112 may all implement the conventional MRS or EMRS commands provided over the bus.

When a selective mode register set operation according to embodiments of the present invention is performed, the same selective mode register set command may be provided on address lines of a clock/command/address bus to a plurality of memory devices, but the mode register set command may be implemented at some of the memory devices and not others based on the mode register set enable/disable signal ID applied to each of the memory devices. As discussed above, a selective mode register set command according to embodiments of the present invention may be identified by providing a logic value "1" on bank address line BA2.

A mode register set operation according to embodiments of the present invention can be initiated by providing command signals CMD (such as /CS, /RAS, /CAS, and /WE all low) corresponding to a mode register set operation, and providing a logic value "1" at bank address pin BA2. As the command signals and bank address signals may be provided over the clock/command/address bus 112 to all memory devices of a module, all memory devices of the module may receive the command and address signals. Each memory device of the module, however, may receive a mode register set enable/disable signal ID over a different signal line from the memory controller. Moreover, the particular mode register set enable/disable signal ID received at a particular memory device may determine whether the mode register set operation is performed at that device.

When command signals CMD corresponding to a mode register set operation are provided to the command decoder 320 of memory device 300, and address signals ADD including a bank address signal BA2 of logic value 1 are provided to the address buffer 350, the memory device may recognizes a selective mode register set operation according to embodiments of the present invention. The memory device 300 determines whether to perform the selective mode register set operation depending on the value of the mode register set enable/disable signal ID provided selectively to the memory device 300 and not provided to other memory devices of the module. If an enabling mode register set enable/disable signal ID is provided to the memory device 300, the selective mode register set operation may be performed in accordance with a mode register set command received over address lines at address buffer 350 according to embodiments of the present invention. More particularly, portions of a mode register set command may be written to a mode register (such as may be provided in the control unit 315) to effect a desired mode of operation. If a disabling mode register set enable/disable signal ID is provided to the memory device 300, the selective mode register set operation may be ignored according to embodiments of the present invention.

Figure 9A:
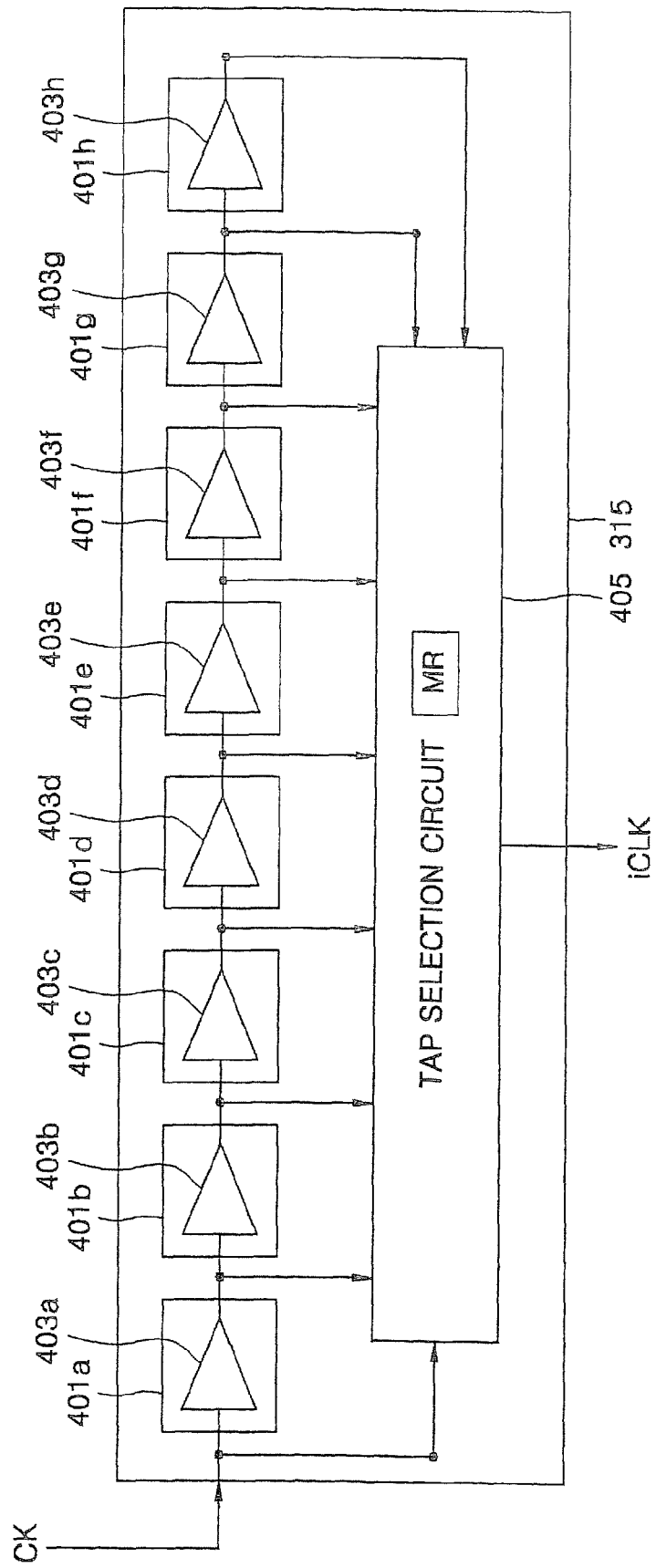
FIG. 9A is a block diagram illustrating an internal clock signal control units according to embodiments of the present invention.

The system clock signal CK may be provided as an input to the control unit of FIG. 8A, and the internal clock signal iCLK may be provided as an output of the control unit 315, as shown in FIG. 9A. More particularly, the control unit 315 of FIG. 8A may include a plurality of delay circuits 401a-h, and each delay circuit may include a respective buffer circuit 403a-h. A tap selection circuit 405 may select the input of delay circuit 401a or the output of one of the delay circuits 401a-h to adjust a timing of the internal clock signal iCLK, and the tap selection may be determined responsive to a selective mode register set operation according to embodiments of the present invention. More particularly, a mode register MR provided in the tap selection circuit 405 may be set responsive to a mode register set command received during a selective mode register set operation for that memory device to thereby effect a desired timing of the internal clock signal.

For example, the tap from delay circuit 401d may be arbitrarily selected as a default tap to provide a default timing output. Taps other than the default tap may be selected to advance or retard the internal clock signal relative to the default tap. Accordingly, the tap selection circuit 405 may select a particular tap thereby defining a timing of the internal clock signal iCLK relative to the system clock signal CK. Moreover, the tap selection circuit 405 may select a particular tap responsive to a selective mode register set operation according to embodiments of the present invention. Accordingly, a delay of the internal clock signal iCLK relative to the system clock signal CK may be different for different memory devices of a memory module to compensate for different propagation delays of the system clock signal CK at different memory devices.

Accordingly, a selective mode register set operation may be preformed for the memory device 300 to adjust a timing of the internal clock signal iCLK relative to the system clock signal CK. The selective mode register set operation may be initiated for the memory device 300 by providing command signals CMD corresponding to a mode register set operation, by providing a mode register set command to the address buffer 350, and by providing an enabling mode register set enable/disable signal ID for the memory device 300. The mode register set command may be identified as a selective mode register set command, for example, by providing a logic value "1" to a bank address line BA2 of the clock/command/address bus 112.

With nine different delay taps for the control unit 315, nine different timing commands MRS1-MRS9 may be provided to define the tap to be selected by the tap selection circuit 405 as illustrated, for example, in FIG. 9B. Moreover, a four bit code may be provided over four predetermined address lines of the clock/command/address bus 112 during a selective mode register set operation to define the different timing commands MRS1-MRS9. For example, each of the delay circuits 401a-h may provide an advance/delay T approximately equal to a difference in a propagation delay of a system clock signal CK between adjacent memory devices along a clock/command/address bus 112, With reference to FIGS. 9A and 9B, timing command MRS1 may provide a relative delay +4T of the internal clock signal iCLK by selecting a tap at the output of delay circuit 401h; timing command MRS2 may provide a relative delay +3T of the internal clock signal iCLK by selecting a tap at the output of delay circuit 401g; timing command MRS3 may provide a relative delay +2T of the internal clock signal iCLK by selecting a tap at the output of delay circuit 401f; timing command MRS4 may provide a relative delay +1T of the internal clock signal iCLK by selecting a tap at the output of delay circuit 401e; timing command MRS5 may provide a reference or default (0 advance or delay) for the internal clock signal iCLK by selecting a tap at the output of delay circuit 401d; timing command MRS6 may provide a relative advance −1T of the internal clock signal iCLK by selecting a tap at the output of delay circuit 401c; timing command MRS7 may provide a relative advance −2T of the internal clock signal iCLK by selecting a tap at the output of delay circuit 401b; timing command MRS8 may provide a relative advance −3T of the internal clock signal iCLK by selecting a tap at the output of delay circuit 401a; and timing command MRS9 may provide a relative advance −4T of the internal clock signal iCL1 by selecting a tap at the input of delay circuit 401a.

With reference to the memory module 200 and the memory controller 100 of FIG. 7, identical memory devices 300M1-300M9 may be provided on the module 200 with each memory device supporting selective mode register set operations according to embodiments of the present invention to support adjustments of the timing of the internal clocks thereof. The memory controller 100 may proceed with nine selective mode register set operations to define operations of the internal clock signal generators of each memory device. For example, the memory controller 100 may provide selective mode register set commands to adjust internal clock signal timings based on the position of each memory device 300M1-300M9 and assumed propagation delays of the system clock signal CK at each memory device position. In an alternative, the memory controller 100 may provide selective mode register set commands to adjust internal clock timings based on measured performance of individual memory devices of the module 200.

According to particular embodiments of the present invention, the selective mode register set commands MRS1-MRS9 of FIG. 9B may be selectively applied to the respective memory devices 300M1-300M9. In a first selective mode register set operation, the mode register set command MRS1 may be applied to all memory devices 300M1-300M9 along clock/command/address bus 112, an enabling mode register set enable/disable signal ID1 may be applied to memory device 300M1, and disabling mode register set enable/disable signals ID2-ID9 may be applied to memory devices 300M2-300M9. In a second selective mode register set operation, the mode register set command MRS2 may be applied to all memory devices 300M1-300M9 along clock/command/address bus 112, an enabling mode register set enable/disable signal ID2 may be applied to memory device 300M2, and disabling mode register set enable/disable signals ID1 and ID3-ID9 may be applied to memory devices 300M1 and 300M3-300M9. In a third selective mode register set operation, the mode register set command MRS3 may be applied to all memory devices 300M1-300M9 along clock/command/address bus 112, an enabling mode register set enable/disable signal ID3 may be applied to memory device 300M3, and disabling mode register set enable/disable signals ID1-ID2 and ID4-ID9 may be applied to memory devices 300M1-300M2 and 300M4-300M9. In a fourth selective mode register set operation, the mode register set command MRS4 may be applied to all memory devices 300M1-300M9 along clock/command/address bus 112, an enabling mode register set enable/disable signal ID4 may be applied to memory device 300M4, and disabling mode register set enable/disable signals ID1-ID3 and ID5-ID9 may be applied to memory devices 300M1-300M3 and 300M5-300M9.

In a fifth selective mode register set operation, the mode register set command MRS5 may be applied to all memory devices 300M1-300M9 along clock/command/address bus 112, an enabling mode register set enable/disable signal ID5 may be applied to memory device 300M5, and disabling mode register set enable/disable signals ID1-ID4 and ID6-ID9 may be applied to memory devices 300M1-300M4 and 300M6-300M9. In a sixth selective mode register set operation, the mode register set command MRS6 may be applied to all memory devices 300M1-300M9 along clock/command/address bus 112, an enabling mode register set enable/disable signal ID6 may be applied to memory device 300M6, and disabling mode register set enable/disable signals ID1-ID5 and ID7-ID9 may be applied to memory devices 300M1-300M5 and 300M7-300M9. In a seventh selective mode register set operation, the mode register set command MRS7 may be applied to all memory devices 300M1-300M9 along clock/command/address bus 112, an enabling mode register set enable/disable signal ID7 may be applied to memory device 300M7, and disabling mode register set enable/disable signals ID1-ID6 and ID8-ID9 may be applied to memory devices 300M1-300M6 and 300M8-300M9. In a eighth selective mode register set operation, the mode register set command MRS8 may be applied to all memory devices 300M1-300M9 along clock/command/address bus 112, an enabling mode register set enable/disable signal ID8 may be applied to memory device 300M8, and disabling mode register set enable/disable signals ID1-ID7 and ID9 may be applied to memory devices 300M1-300M7 and 300M9. In a ninth selective mode register set operation, the mode register set command MRS9 may be applied to all memory devices 300M1-300M9 along clock/command/address bus 112, an enabling mode register set enable/disable signal ID9 may be applied to memory device 300M9, and disabling mode register set enable/disable signals ID1-ID8 may be applied to memory devices 300M1-300M8.

Figure 10:
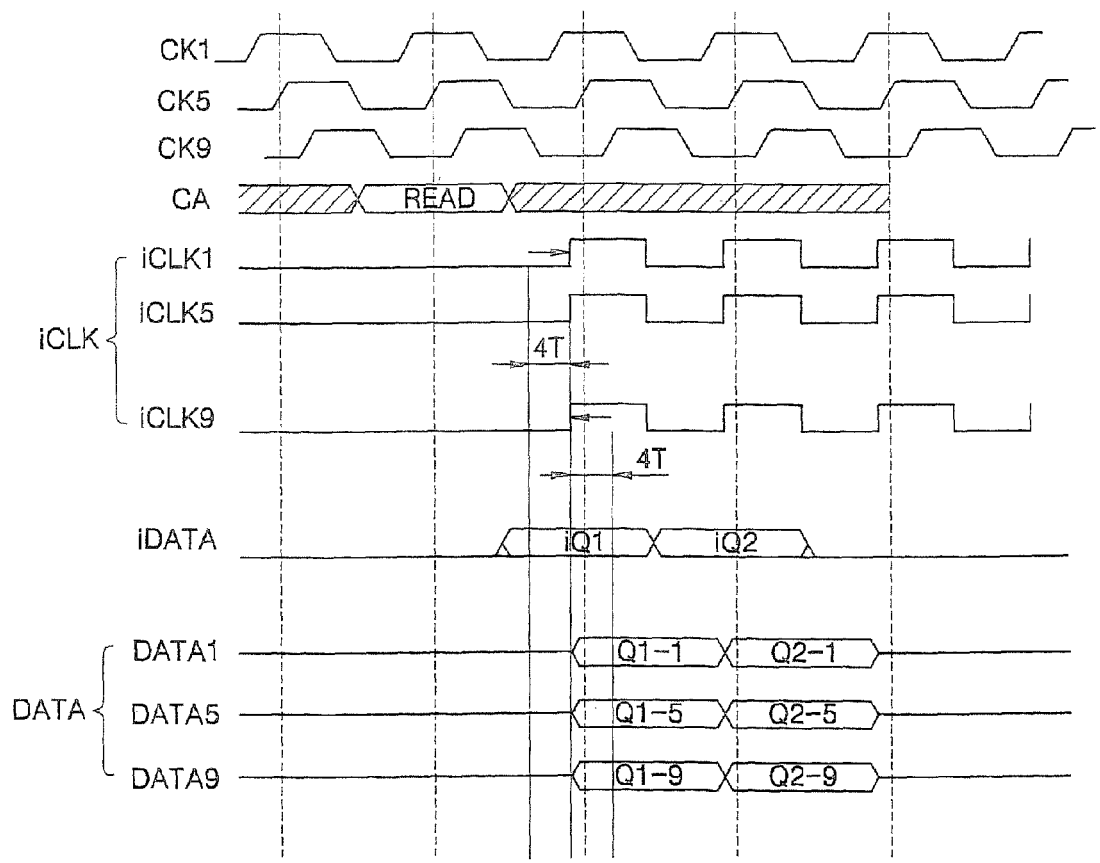
FIG. 10 is a timing diagram illustrating internal clock signal timing during read operations according to embodiments of the present invention.
Figure 11:
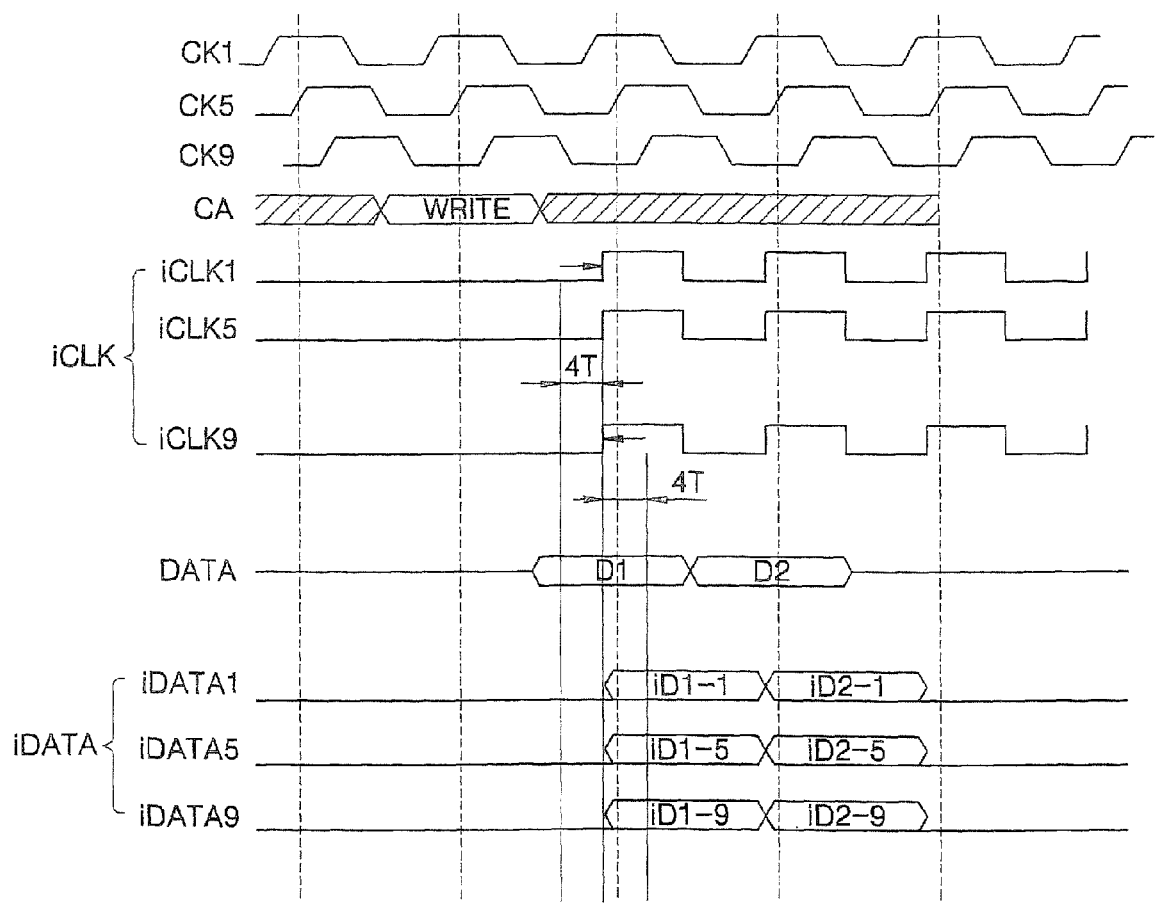
FIG. 11 is a timing diagram illustrating internal clock signal timing during write operations according to embodiments of the present invention.

As illustrated in the timing diagrams of FIGS. 10 and 11, the selective mode register set operations discussed above may provide an approximate synchronization of internals clock signals iCLK for different memory devices 300M1-300M9 of the memory module 200 illustrated in FIG. 7. During a read operation illustrated in FIG. 10, transitions of the system clock signal CK are received by different memory devices of the memory module at different times due to different propagation delays along the clock/command/address bus 112. More particularly, a rising edge of the system clock signal may be received at memory device 300M1 before it is received at memory device 300M5 as shown by signals CK1 and CK5, and a rising edge of the system clock signal may be received at memory device 300M5 before it is received at memory device 300M9 as shown by signals CK5 and CK9. Because timings of the internal clock signals of the memory devices have been selectively adjusted using selective mode register set operations, the internal clock signals iCLK1, iCLK5, and iCLK9 may be approximately synchronized. More particularly, a delay of the internal clock signal iCLK1 can be increased relative to the clock signal CK1 received at the first memory device 300M1, a default delay of the internal clock signal iCLK5 can be maintained relative to the clock signal CK5 received at the fifth memory device 300M5, and a delay of the internal clock signal iCLK9 can be reduced relative to the clock signal CK9 received at the memory device 300M9.

Accordingly, a timing for latching internal data iDATA for each memory device 300M1-300M9 into the respective input/output buffers may be determined with respect to the approximately synchronized internal clock signals iCLK1-9. A timing for providing the data signals DATA1-DATA9 to the memory controller 100 over respective data buses may thus also be approximately synchronized. Accordingly, the data signals DATA1-DATA9 may be provided on the respective data buses at approximately the same time during a data read operation, and data skew may thus be reduced.

During a write operation illustrated in FIG. 11, transitions of the system clock signal CK are received by different memory devices of the memory module at different times due to different propagation delays along the clock/command/address bus 112. As discussed above, internal clock signals iCLK1-iCLK9 may be approximately synchronized. Accordingly, a timing for latching data signals DATA from the memory controller for each memory device 300M1-300M9 into the respective input/output buffers may be determined with respect to the approximately synchronized internal clock signals iCLK1-9. A timing for providing the internal data iDATA1-iDATA9 from the input/output buffers to the memory cell array 340 over respective data buses may thus also be approximately synchronized. Accordingly, the data signals DATA1-DATA9 may be received into the respective input/output buffers of the memory devices of a module at approximately the same time during a data write operation, and data skew may thus be reduced.

In a memory module 200 including a plurality of memory devices 300M1-300Mn, a mode register set command may be provided over a clock/command/address bus 112 that is coupled to all of the memory devices 300M1-300Mn. Mode register set enable/disable signals ID1-Idn, however, may be separately provided between the memory controller 100 and the respective memory devices 300M1-300Mn. As discussed above, a bit of a mode register set command may identify a selective mode register set command according to embodiments of the present invention, an enabling mode register set enable/disable signal(s) may identify a respective memory device(s) to which the selective mode register set command is to be applied, and a disabling mode register set enable/disable signal(s) may identify a respective memory device(s) for which the selective mode register set command is not to be applied. If only mode register set enable/disable signal ID1 is enabling and mode register set enable/disable signals ID2-Idn are disabling, the selective mode register set command is only applied to memory device 300M1. In an alternative, enabling mode register set enable/disable signals may be applied to a plurality of memory devices during a selective mode register set operation so that the selective mode register set operation is applied to the plurality of the enabled memory devices at the same time. A selective mode register set operation according to embodiments of the present invention may thus be applied to one memory device of the module, a plurality of memory devices of the module, or all of the memory devices of the module.

As discussed above, a mode register MR according to embodiments of the present invention may be considered a portion of internal clock generator 310 and more particularly as a portion of tap selection circuit 405. In alternatives, a mode register according to embodiments of the present invention may be considered a portion of command decoder 320, address buffer 350, data I/O buffer 330, and/or other portions of the memory device 300. As further discussed above, the mode register MR may store information corresponding to a selective mode register set command defining an operational characteristic (such as internal clock signal advance/delay) for the memory device. Moreover, a single selective mode register set command may be used to set a plurality of operational characteristics (such as internal clock signal advance/delay, output driver strength, data input set up time, and/or data input hold time) for the memory device. According, a single mode register according to embodiments of the present invention may store information corresponding to a selective mode register set command defining a plurality of operational characteristics for the memory device. In an alternative, a plurality of mode registers may be provided for different operational characteristics set using a single selective mode register set command.

Figure 12:
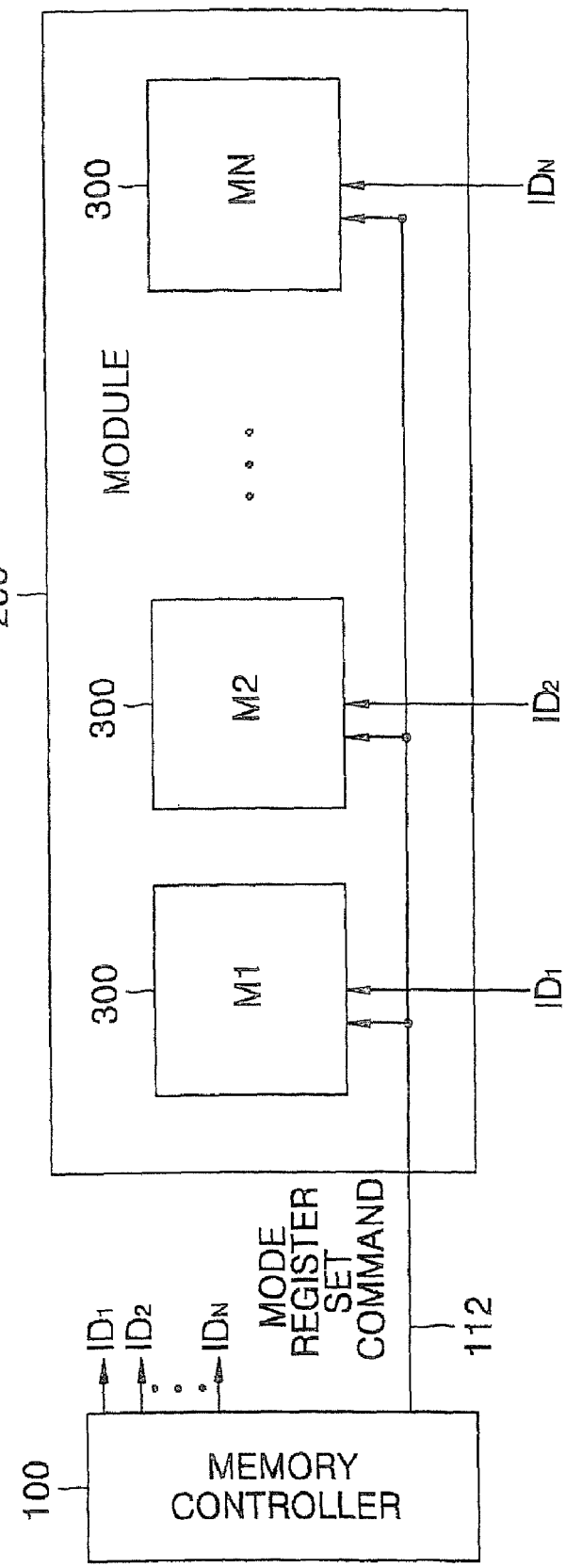
FIG. 12 is a block diagram illustrating couplings of mode register set commands and mode register set enable/disable signals according to embodiments of the present invention.
Figure 13:
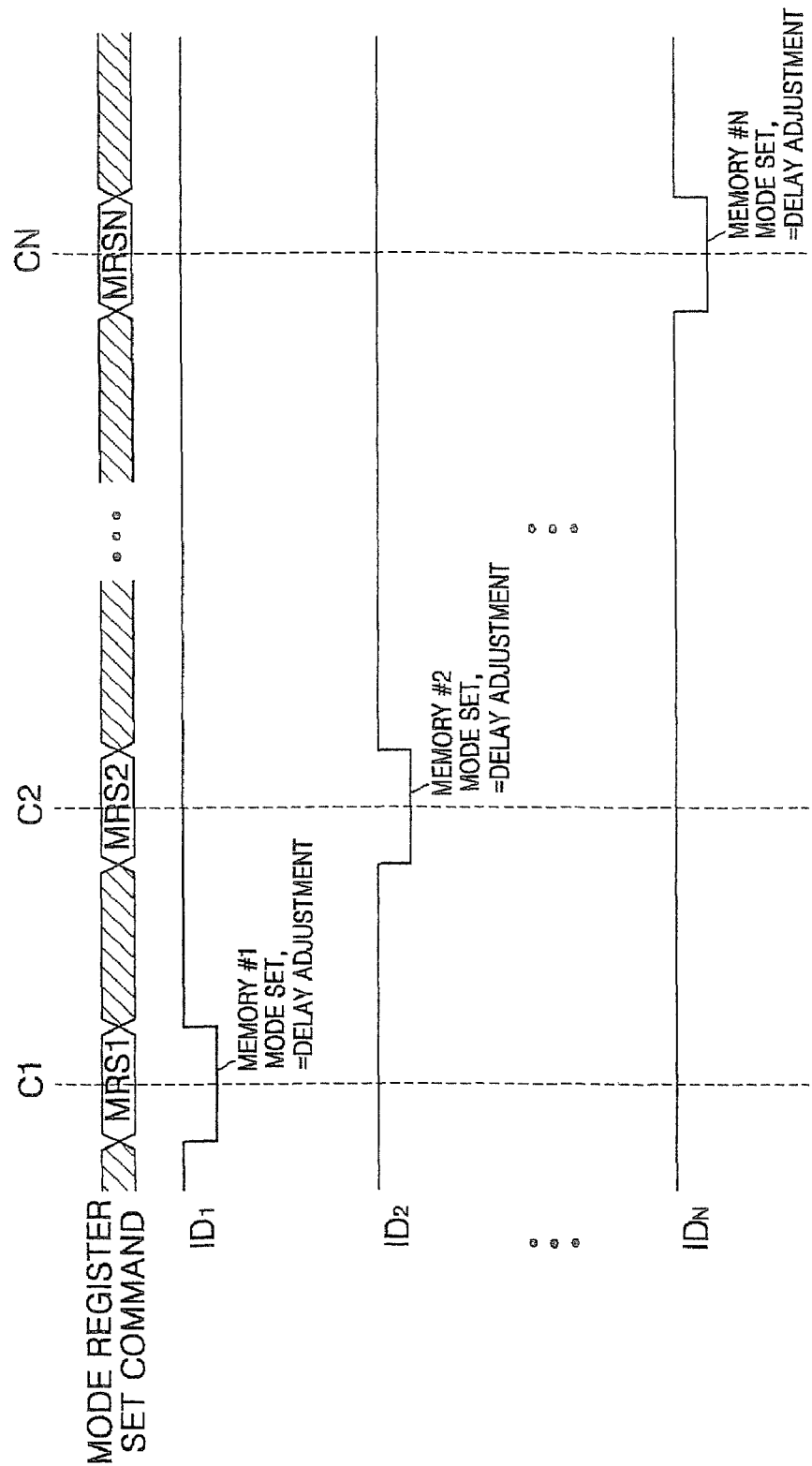
FIG. 13 is a timing diagram illustrating mode register set operations performed using dedicated lines and pins for mode register set enable/disable signals according to embodiments of the present invention.

The timing diagram of FIG. 13 illustrates selective mode register set operations for the memory devices 300M1-300Mn of FIG. 12. In the example of FIG. 13, the mode register set enable/disable signals ID1-IDn are provided over dedicated mode register set enable/disable lines to dedicated mode register set enable/disable pins of the respective memory devices 300M1-300Mn. Stated in other words, the dedicated mode register set enable/disable lines and pins are non-functional during data read and/or write operations.

As shown in FIG. 13, a first mode register set command MRS1 may be applied over the clock/command/address bus 112, an enabling mode register set enable/disable signal ID1 (logic level 0) may be applied to the first memory device 300M1, and disabling mode register set enable/disable signals ID2-Idn (logic level 1) may be applied to the memory devices 300M2-300Mn during a first mode register set operation C1. Accordingly, the first mode register set operation C1 may provide delay adjustment for an internal clock signal iCLK1 of memory device 300M1.

During a second mode register set operation C2, a second mode register set command MRS2 may be applied over the clock/command/address bus 112, an enabling mode register set enable/disable signal ID2 (logic level 0) may be applied to the second memory device 300M2, and disabling mode register set enable/disable signals ID1 and ID3-Idn (logic level 1) may be applied to the memory devices 300M1 and 300M3-300Mn. Accordingly, the second mode register set operation C2 may provide delay adjustment for an internal clock signal iCLK2 of memory device 300M2.

During an $n^{th}$ mode register set operation Cn, an $n^{th}$ mode register set command MRSn may be applied over the clock/command/address bus 112, an enabling mode register set enable/disable signal IDn (logic level 0) may be applied to the $n^{th}$ memory device 300Mn, and disabling mode register set enable/disable signals ID1-ID(n−1) (logic level 1) may be applied to the memory devices 300M1-300M(n−1). Accordingly, the $n^{th}$ mode register set operation Cn may provide delay adjustment for an internal clock signal iCLKn of memory device 300Mn.

The separate mode register set operations may provide different internal clock timing adjustments for different memory devices in a memory module. In addition or in an alternative, separate mode register set operations may provide different driver strengths for different memory devices, different set-up and/or hold times for different memory devices, and/or other characteristics that may vary by memory devices of a same memory module.

Figure 14:
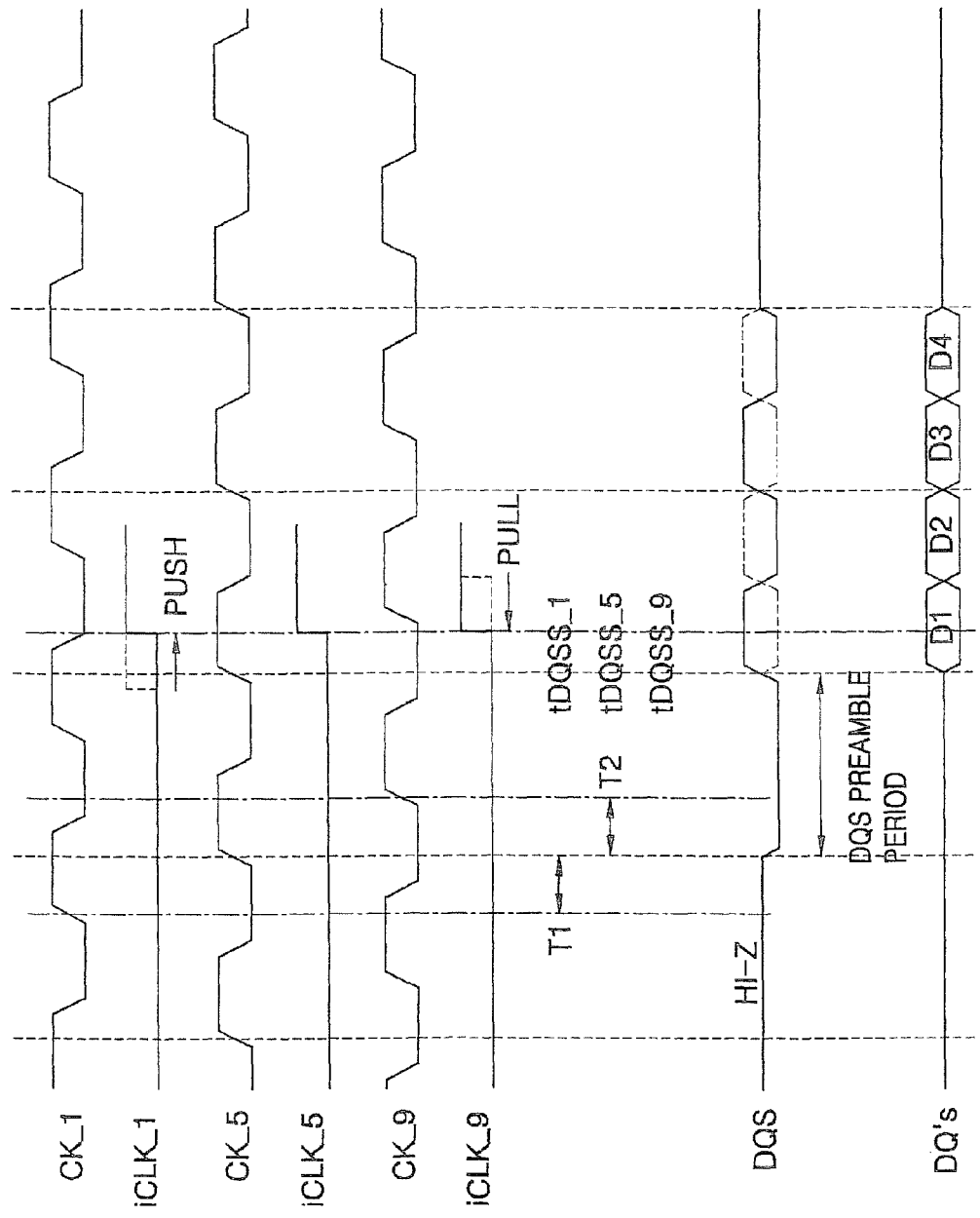
FIG. 14 is a timing diagram illustrating data strobe and internal clock signal operations according to embodiments of the present invention.

FIG. 14 is a timing diagram illustrating a write operation of the memory module 200 including memory devices 300M1-300M9 during a write operation. As shown, a transition of the system clock signal may be received at the first memory device 300M1 before the fifth memory device 300M5 as shown by signals CK1 and Ck5, and the transition of the system clock signal may be received at the fifth memory device 300M5 before the ninth memory device 300M9 as shown by signals CK5 and CK9. As discussed above, selective mode register set operations may provide adjustment of the internal clock signals iCLK1-iCLK9 so that the internal clock signals are approximately synchronized.

During the write operation, the data strobe signals DQS for each memory device transition from a high-impedance state (Hi-Z) to a logic low state, and the data strobe signals are maintained at the low state for the DQS preamble period before the data signals DATA are set up on the respective data buses. Subsequent transitions of the data strobe signals may signal provision of new data D1-D4 for each of the memory devices on the respective data buses. Accordingly, a skew between the transition of the from the Hi-Z state to the low impedance state and a rising edge of the system clock signal received at each of the memory devices may limit high frequency memory operations. By approximately synchronizing internal clock signals of the different memory devices, the data strobe signals may be approximately synchronized with respect to the internal clock signals of the different memory devices so that a frequency of operation may be increased.

Figure 15:
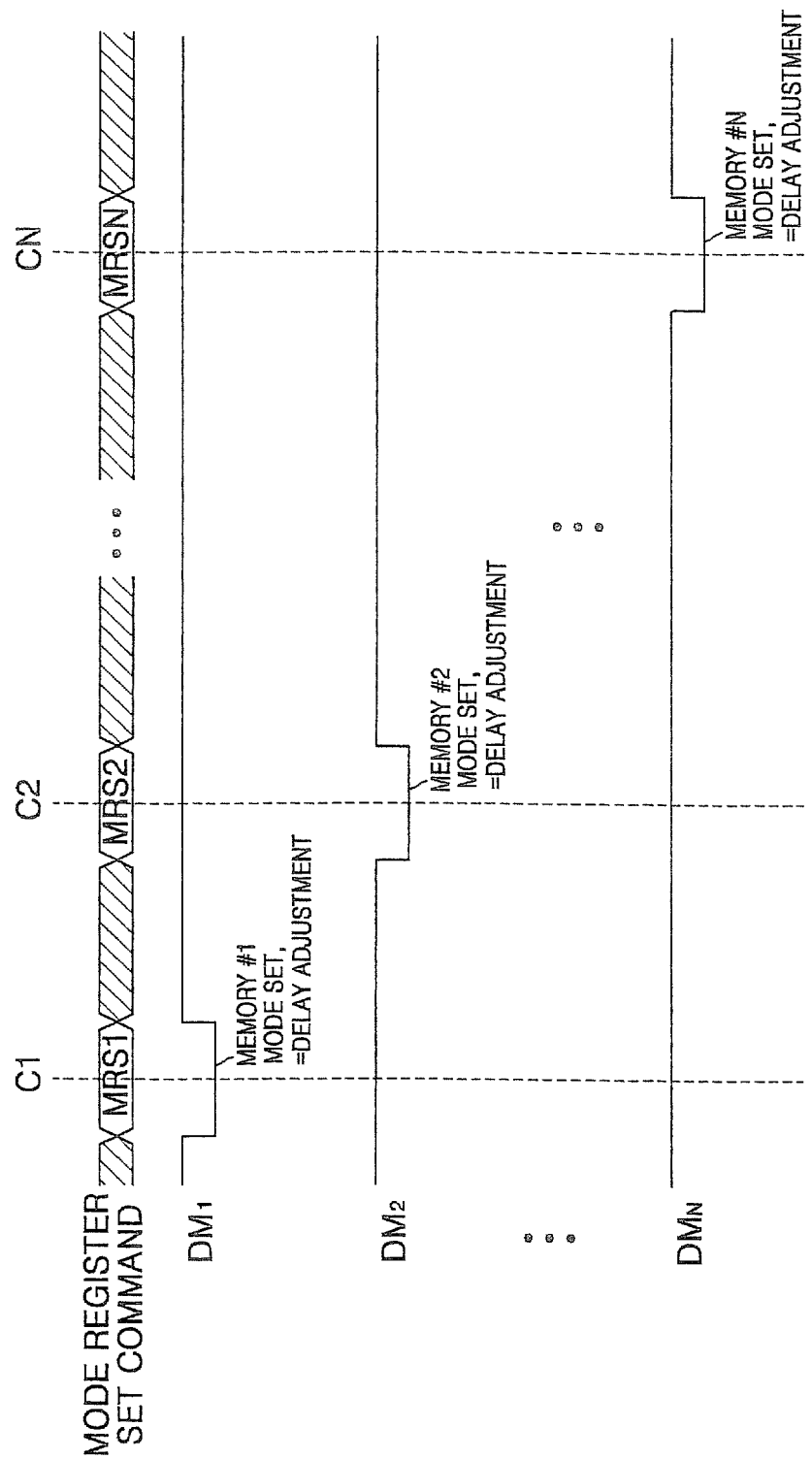
FIG. 15 is a timing diagram illustrating mode register set operations performed using data mask lines and pins for mode register set enable/disable signals according to embodiments of the present invention.

The timing diagram of FIG. 15 illustrates selective mode register set operations for each of the memory devices 300M1-300Mn of FIG. 12. In the example of FIG. 15, the mode register set enable/disable signals ID1-IDn are provided over data mask lines to data mask pins of the respective memory devices 300M1-300M9 during selective mode register set operations. During read and/or write operations, the data mask lines and pins are used to provide data mask signals to the respective memory devices. Because the mode register set enable/disable signals ID1-ID9 are provided over data mask lines and pins, the mode register set enable/disable signals are labeled DM1-DMn in FIG. 15.

As shown in FIG. 15, a first selective mode register set command MRS1 may be applied over the clock/command/address bus 112, an enabling mode register set enable/disable signal ID1 may be applied as DM1 to the first memory device 300M1, and disabling mode register set enable/disable signals TD2-IDn may be applied as DM2-DMn to the memory devices 300M2-300Mn during a first selective mode register set operation C1. Accordingly, the first mode register set operation C1 may provide delay adjustment for an internal clock signal iCLK1 of memory device 300M1.

During a second selective mode register set operation C2, a second selective mode register set command MRS2 may be applied over the clock/command/address bus 112, an enabling mode register set enable/disable signal ID2 may be applied as DM2 to the second memory device 300M2, and disabling mode register set enable/disable signals ID1 and ID3-Idn may be applied as DM1 and DM3-DMn to the memory devices 300M1 and 300M3-300Mn. Accordingly, the second selective mode register set operation C2 may provide delay adjustment for an internal clock signal iCLK2 of memory device 300M2.

During an $n^{th}$ selective mode register set operation Cn, an $n^{th}$ selective mode register set command MRSn may be applied over the clock/command/address bus 112, an enabling mode register set enable/disable signal IDn may be applied as DMn to the $n^{th}$ memory device 300Mn, and disabling mode register set enable/disable signals ID1-ID(n−1) may be applied as DM1-DM(n−1) to the memory devices 300M1-300M(n−1). Accordingly, the $n^{th}$ selective mode register set operation Cn may provide delay adjustment for an internal clock signal iCLKn of memory device 300Mn.

According to embodiments illustrated in FIG. 15, additional dedicated mode register set enable/disable lines and pins are not required because existing data mask lines and pins are used. Selective mode register set operations according to embodiments of the present invention can thus be provided without increasing a pin count of memory devices supporting the selective mode register set operations.

Figure 16:
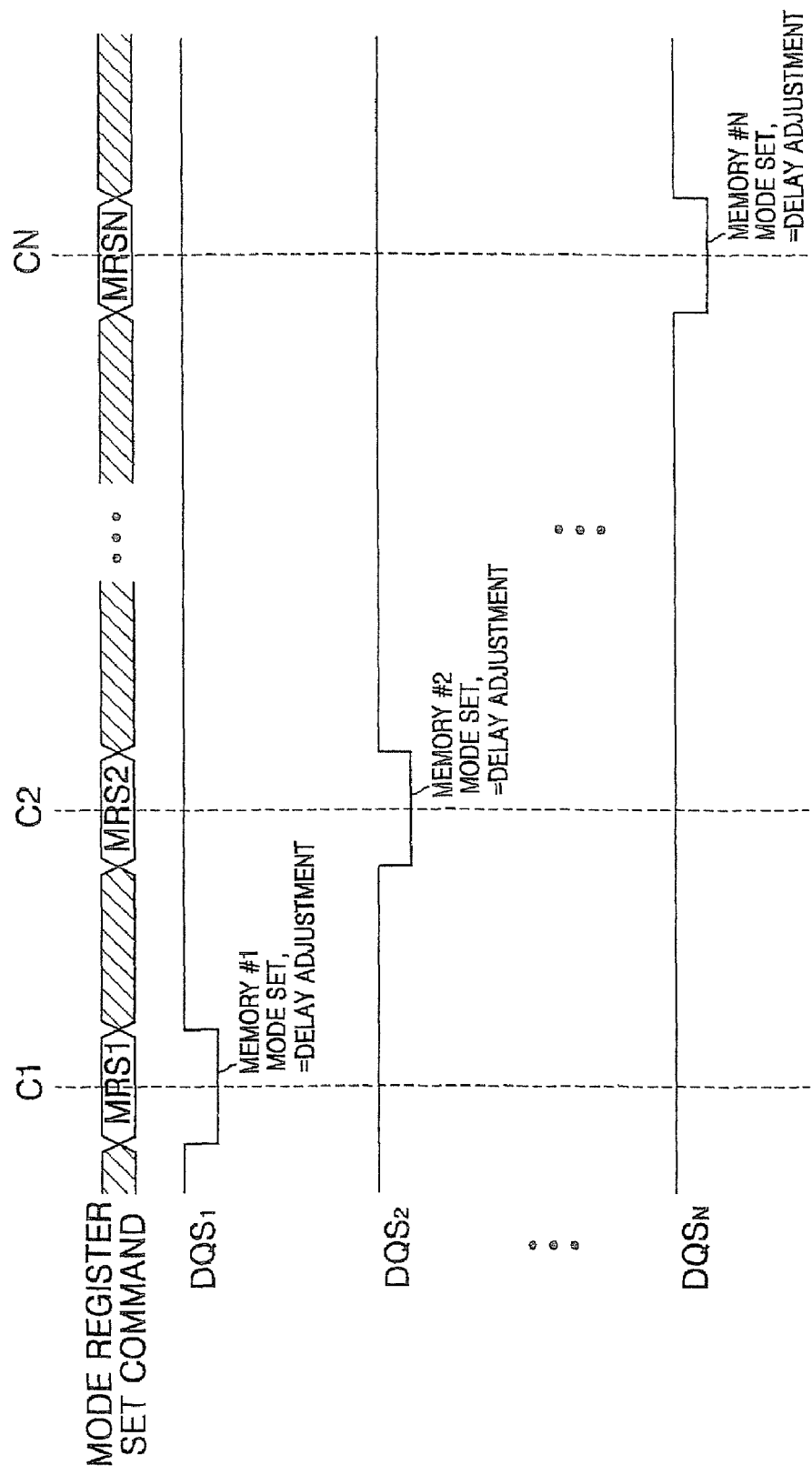
FIG. 16 is a timing diagram illustrating mode register set operations performed using data strobe lines and pins for mode register set enable/disable signals according to embodiments of the present invention.

The timing diagram of FIG. 16 illustrates selective mode register set operations for each of the memory devices 300M1-300Mn of FIG. 12. In the example of FIG. 16, the mode register set enable/disable signals ID1-IDn are provided over data strobe lines to data strobe pins of the respective memory devices 300M1-300M9 during selective mode register set operations. During read and/or write operations, the data strobe lines and pins are used to provide data strobe signals to the respective memory devices. Because the mode register set enable/disable signals ID1-ID9 are provided over data strobe lines and pins, the mode register set enable/disable signals are labeled DQS1-DQSn in FIG. 15.

As shown in FIG. 16, a first mode register set command MRS1 may be applied over the clock/command/address bus 112, an enabling mode register set enable/disable signal ID1 may be applied as DQS1 to the first memory device 300M1, and disabling mode register set enable/disable signals TD2-IDn may be applied as DQS2-DQSn to the memory devices 300M2-300Mn during a first mode register set operation C1. Accordingly, the first mode register set operation C1 may provide delay adjustment for an internal clock signal iCLK1 of memory device 300M1.

During a second mode register set operation C2, a second mode register set command MRS2 may be applied over the clock/command/address bus 112, an enabling mode register set enable/disable signal ID2 may be applied as DQS2 to the second memory device 300M2, and disabling mode register set enable/disable signals ID1 and ID3-IDn may be applied as DQS1 and DQS3-DQSn to the memory devices 30M1 and 300M3-300Mn. Accordingly, the first mode register set operation C2 may provide delay adjustment for an internal clock signal iCLK2 of memory device 300M2.

During an $n^{th}$ mode register set operation Cn, an $n^{th}$ mode register set command MRSn may be applied over the clock/command/address bus 112, an enabling mode register set enable/disable signal IDn may be applied as DQSn to the $n^{th}$ memory device 300Mn, and disabling mode register set enable/disable signals ID1-ID(n−1) may be applied as DQS1-DQS(n−1) to the memory devices 300M1-300M(n−1). Accordingly, the $n^{th}$ mode register set operation Cn may provide delay adjustment for an internal clock signal iCLKn of memory device 300Mn.

According to embodiments illustrated in FIG. 16, additional dedicated mode register set enable/disable lines and pins are not required because existing data strobe lines and pins are used. Selective mode register set operations according to embodiments of the present invention can thus be provided without increasing a pin count of memory devices supporting the selective mode register set operations.

Figure 17:
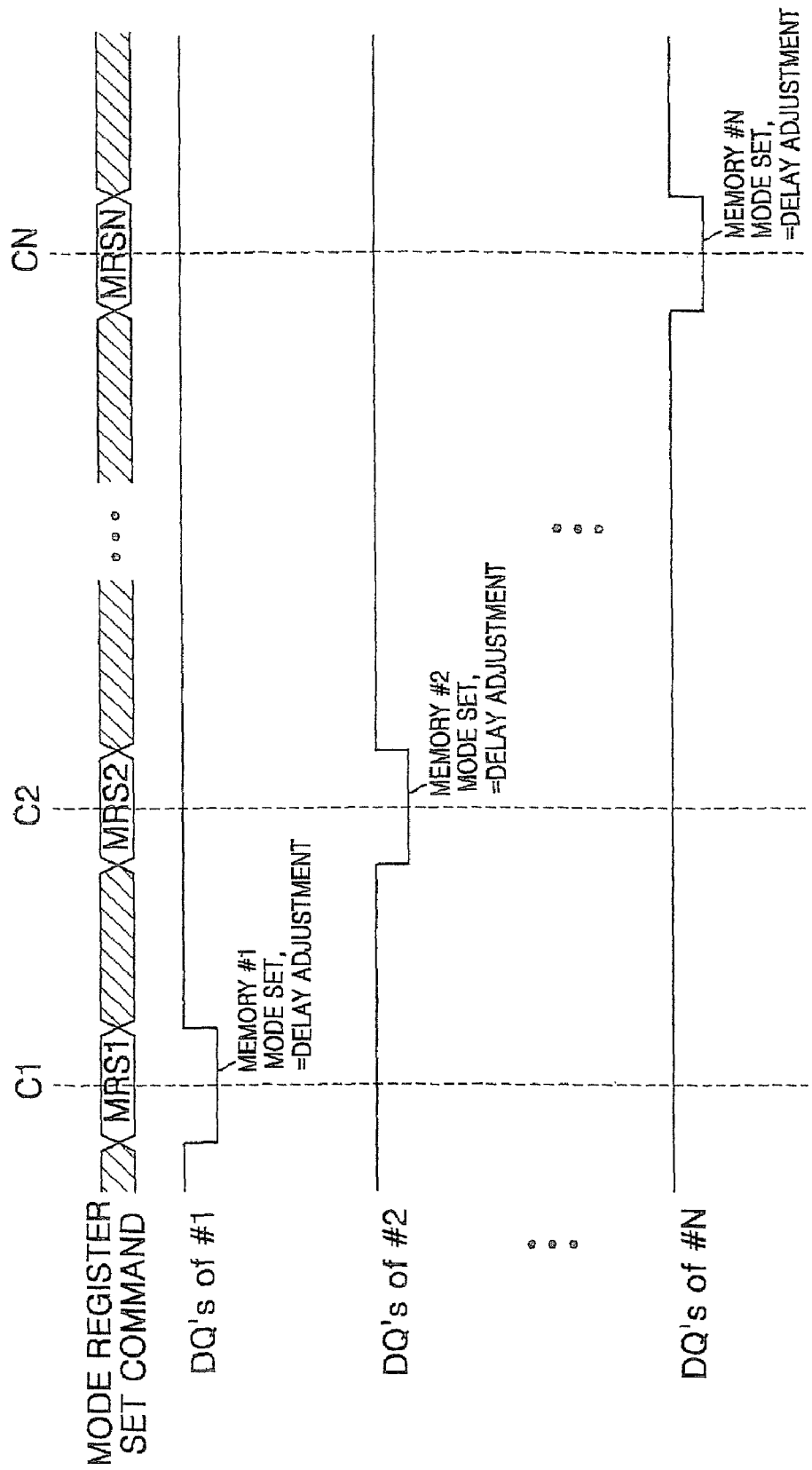
FIG. 17 is a timing diagram illustrating mode register set operations performed using data signal lines and pins for mode register set enable/disable signals according to embodiments of the present invention.

The timing diagram of FIG. 17 illustrates selective mode register set operations for each of the memory devices 300M1-300Mn of FIG. 12. In the example of FIG. 17, the mode register set enable/disable signals ID1-IDn are provided over data signal lines to data signal pins of the respective memory devices 300M1-300M9 during selective mode register set operations. During read and/or write operations, the data signal lines and pins are used to transmit data being read from and written to the respective memory devices. Because the mode register set enable/disable signals ID1-ID9 are provided over data signal lines and pins, the mode register set enable/disable signals are labeled DQ1-DQn in FIG. 15. A plurality of data signal pins may be provided on each memory device, but a single one of the data signal pins on each memory device may be used during selective mode register set operations to receive a mode register set enable/disable signal.

As shown in FIG. 17, a first mode register set command MRS1 may be applied over the clock/command/address bus 1127 an enabling mode register set enable/disable signal ID1 may be applied as DQ1 to the first memory device 300M1, and disabling mode register set enable/disable signals ID2-IDn may be applied as DQ2-DQn to the memory devices 300M2-300Mn during a first mode register set operation C1. Accordingly, the first mode register set operation C1 may provide delay adjustment for an internal clock signal iCLK1 of memory device 300M1.

During a second mode register set operation C2, a second mode register set command MRS2 may be applied over the clock/command/address bus 112, an enabling mode register set enable/disable signal ID2 may be applied as DQ2 to the second memory device 300M2, and disabling mode register set enable/disable signals ID1 and ID3-IDn may be applied as DQS1 and DQ3-DQn to the memory devices 300M1 and 300M3-300Mn. Accordingly, the first mode register set operation C2 may provide delay adjustment for an internal clock signal iCLK2 of memory device 300M2.

During an $n^{th}$ mode register set operation Cn, an $n^{th}$ mode register set command MRSn may be applied over the clock/command/address bus 112, an enabling mode register set enable/disable signal IDn may be applied as DQn to the $n^{th}$ memory device 300Mn, and disabling mode register set enable/disable signals ID1-ID(n−1) may be applied as DQ1-DQ(n−1) to the memory devices 300M1-300M(n−1). Accordingly, the $n^{th}$ mode register set operation Cn may provide delay adjustment for an internal clock signal iCLKn of memory device 300Mn.

According to embodiments illustrated in FIG. 17, additional dedicated mode register set enable/disable lines and pins are not required because existing data strobe lines and pins are used. Selective mode register set operations according to embodiments of the present invention can thus be provided without increasing a pin count of memory devices supporting the selective mode register set operations.

As discussed above, selective mode register set operations according to embodiments of the present invention may be used to selectively adjust timings of internal clock signals of different memory devices sharing a same clock/command/address bus. In addition or in an alternative, selective mode register set operations according to embodiments of the present invention may be used to selective set, adjust, and/or change operational characteristics of memory devices sharing a same clock/command/address bus other than internal clock signal timing.

Figure 18:
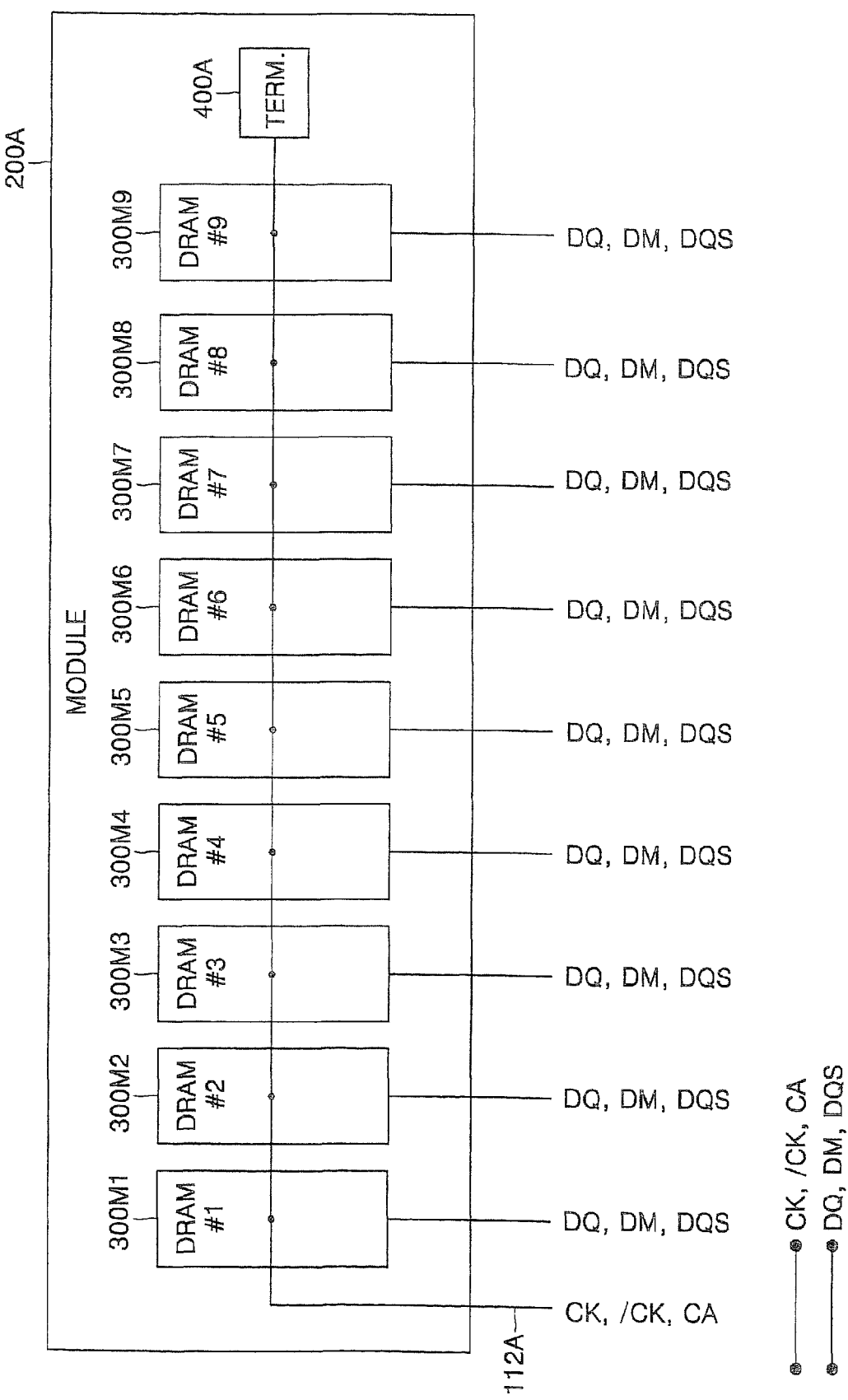
FIG. 18 is a block diagram illustrating topologies for memory modules according to embodiments of the present invention.

In addition, layouts of memory modules other than those illustrated in FIG. 7 may be provided according to embodiments of the present invention. As shown in FIG. 18, the clock/command/address bus 112A may enter the memory module 200A at a first end of a row of memory devices 300M1-300M9, and terminations 400A may be provided for the lines of the bus 112 at a second end of the row of memory devices. More particularly, the terminations may include resisters coupled between ends of respective lines and a reference voltage (such as a supply voltage Vcc). By providing the terminations 400A, a quality of clock, command, and/or address signals provided along lines of the clock/command/address bus 112 may be improved.

Figure 19:
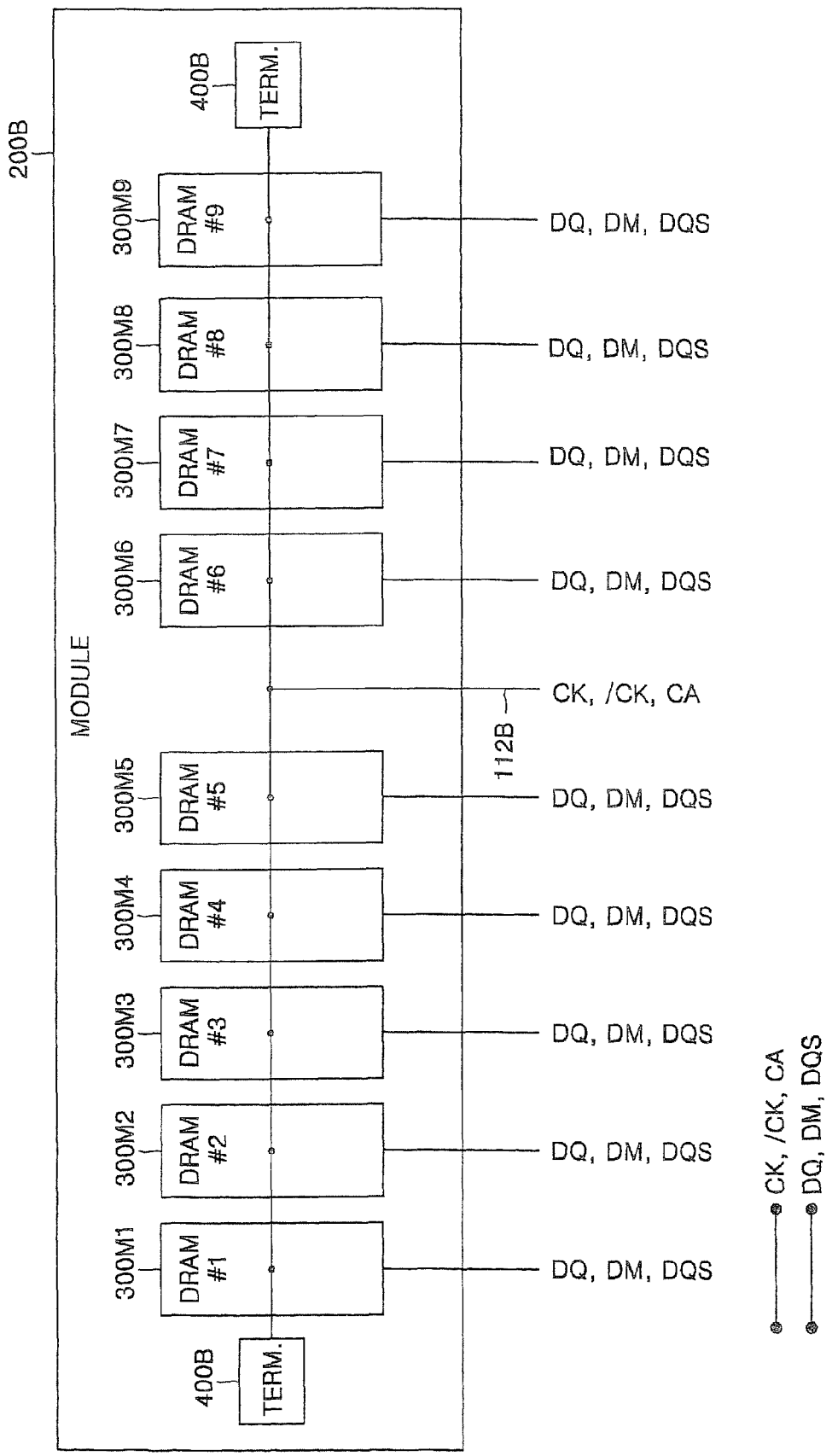
FIG. 19 is a block diagram illustrating additional topologies for memory modules according to embodiments of the present invention.

As shown in FIG. 19, a clock/command/address bus 112B may enter the memory module 200B between memory devices in the row of memory devices 300M1-300M9, and the bus 112 may extend in opposite directions. Moreover, terminations 400B may be provided for the bus 112 at opposite ends of the row of memory devices 300M1-300M9. Each line of the bus 112 may thus be terminated using a pair of resistors, with a first resistor of the pair terminating the line at a first end of the row of memory devices and with a second resistor of the pair terminating the line at a second end of the row of memory devices. By providing that the bus is led from approximately a center of the row of memory devices, a skew of the system clock signal received at different memory devices in the row can be reduced. In the example of FIG. 7, a transition of the system clock signal may be received at memory device 300M9 a period of time 8T after the transition is received is received at memory device 300M1. Assuming an additional propagation delay of T for each memory device along the bus 112B of FIG. 19, a transition of the system clock signal may be received at memory device 300M1 a period of time 4T after the transition is received at memory device 300M5. Accordingly, a maximum skew of the system clock signal received different memory devices of module 200B may be reduced by a factor of approximately 2.

Figure 20:
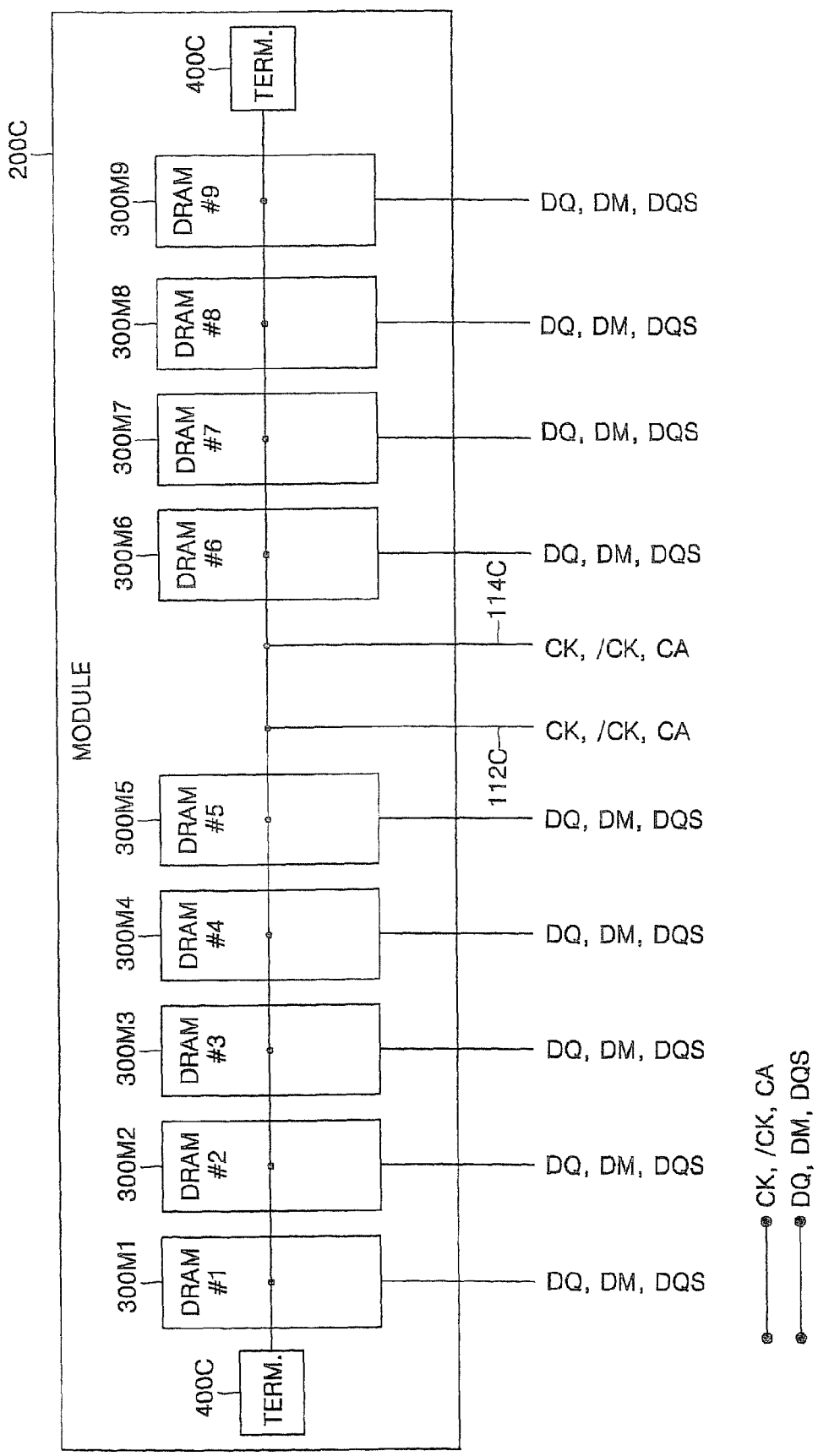
FIG. 20 is a block diagram illustrating yet additional topologies for memory modules according to embodiments of the present invention.

As shown in FIG. 20, separate clock/command/address buses 112C and 114C may be provided for different groups of the memory devices in a row of the memory module 200C. For example, memory devices 300M1-300M5 may be provided along bus 112c, and memory devices 300M6-300M9 may be provided along bus 114C. Moreover, terminations 400C may be provided at ends of each of the buses 112C and 114C. While shown with the buses 112c and 114C entering at a middle of the row of memory devices with terminations 400C at ends of the row of memory devices, the buses 112C and 114C may enter at opposite ends of the row of memory devices with terminations being provided at a middle of the row of memory devices. A maximum skew of a transition of the system clock signal received at different memory devices can thus be reduced as discussed above with respect to FIG. 19.

By providing separate buses 112C and 114C, selective mode register set operations according to embodiments of the present invention may be performed for different memory devices of the module 200C at the same time. If a separate selective mode register set operation is performed for each of the memory devices 300M1-300M9, for example, five sequential mode register set operations for memory devices 300M1-300M5 may be performed in parallel with four sequential mode register set operations for memory devices 300M6-300M9. A time required to perform separate selective mode register set operations from nine memory devices using two separate clock/command/address buses can thus be reduced as compared with performing nine sequential mode register set operations using a single clock/command/address bus.

Figure 21:
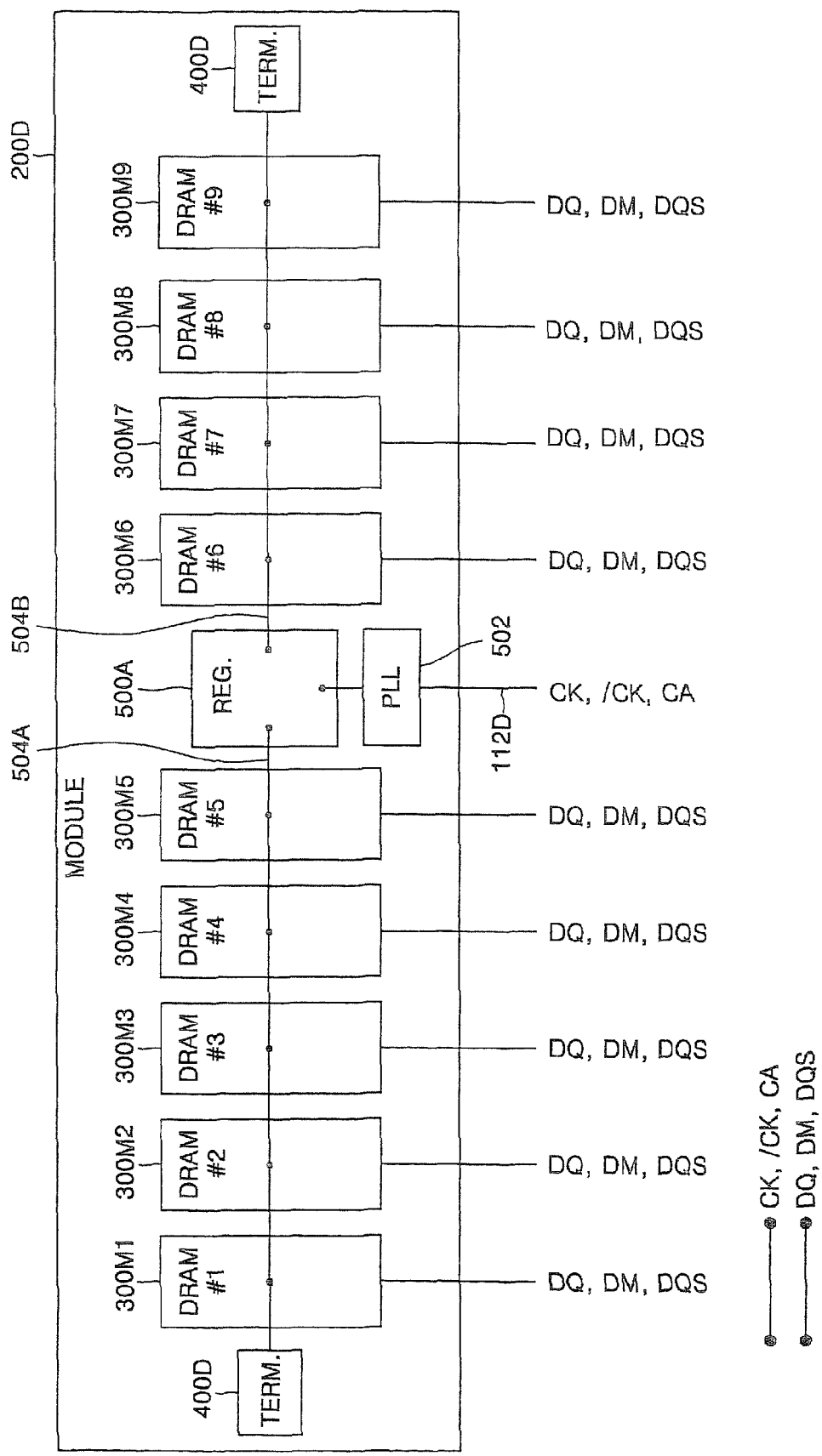
FIG. 21 is a block diagram illustrating still additional topologies for memory modules according to embodiments of the present invention.

As shown in FIG. 21, a clock/command/address bus 112D from a memory controller may feed a register 500A providing separately buffered clock/command/address signals on buses 504A and 504B. A phase-locked-loop (PLL) circuit 502 may be provided to improve a system clock signal received from a memory controller, and terminations 400D may be provided at ends of the buses 504A-B. By providing separate buses 504A-B both fed from the register 500A, a maximum skew of a transition of a system clock signal received at different memory devices can be reduced. As shown, the register 500A and the phase-locked-loop circuit 502 may be provided together. In alternatives, the register 500A may be provided without the phase-locked-loop circuit 502, or the phase-locked-loop circuit may be provided without the register 500A.

Figure 22:
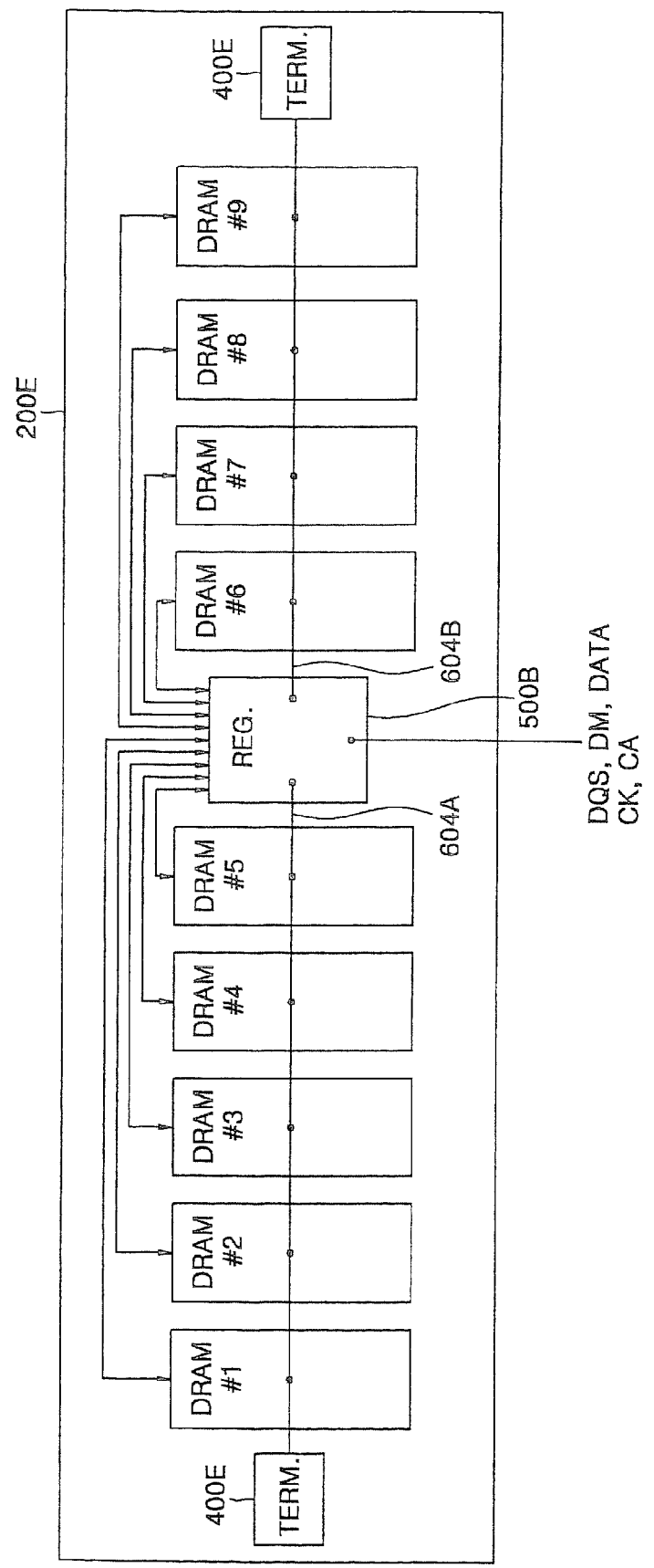
FIG. 22 is a block diagram illustrating more topologies for memory modules according to embodiments of the present invention.

As shown in FIG. 22, clock/command/address signals and data signals for all of the memory devices of memory module 200F may be provided from a memory controller to register 500B, and the clock/command/address signals may be separately buffered and provided on buses 604A-B as discussed above with respect to FIG. 21. In addition, the register 500B may provide separate data signals DATA, separate data mask signals DM, and separate data strobe signals DQS over separate buses to each of the memory devices 300M1-300M9. Moreover, terminations 400E may be provided for each of the buses 604A-B. While not shown in FIG. 22, a phase-locked-loop (PLL) circuit may be provided for the system clock signal as discussed above with respect to FIG. 21.

Figure 23:
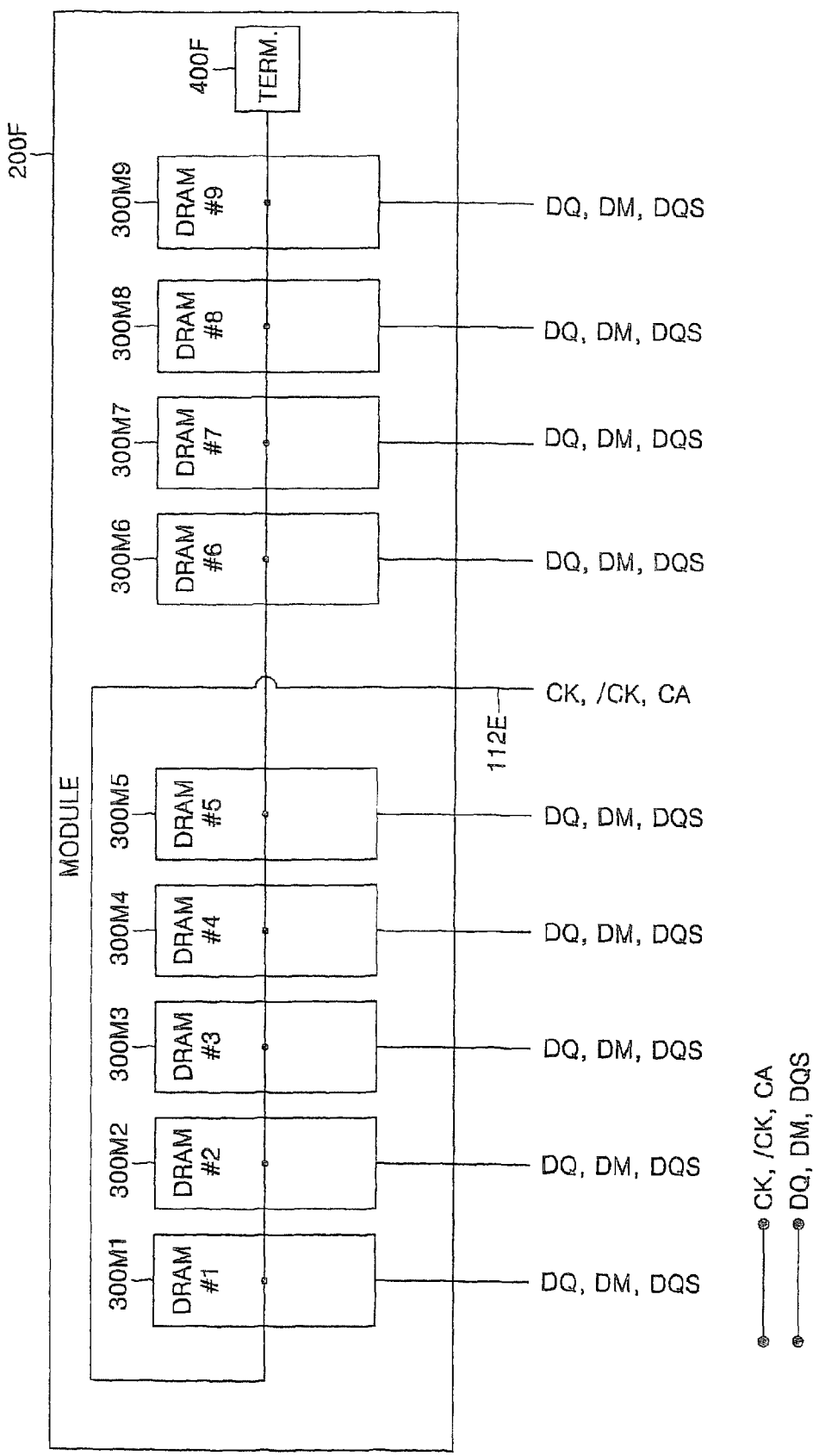
FIG. 23 is a block diagram illustrating still more topologies for memory modules according to embodiments of the present invention.

As shown in FIG. 23, a fly-by topology for the clock/command/address bus 112 may be provided with the clock/command/address bus 112 entering the memory module 200F between memory devices in the row of memory devices 300M1-300M9. Such a topology may provide an advantageous layout for coupling with a memory controller.

As discussed above, selective mode register set operations according to embodiments of the present invention may be used to selectively adjust timings of internal clock signals of different memory devices sharing a same clock/command/address bus. In addition or in an alternative, selective mode register set operations according to embodiments of the present invention may be used to selectively set, adjust, and/or change operational characteristics of memory devices sharing a same clock/command/address bus other than internal clock signal timing. For example, selective mode register set operations according to embodiments of the present invention may be used to set different driver strengths for different memory devices sharing a same clock/command/address bus.

For example, each memory device 300M1-300M9 of memory module 200 may include a respective data I/O buffer 330 as discussed above with respect to FIGS. 7 and 8. Moreover, the data signals DATA for each memory device 300 may include a plurality of data bits DQ, and the internal data signals iDATA for each memory device 300 may include a respective plurality of internal data bits iDQ. Accordingly, the data I/O buffer 330 may include a plurality of output drivers 150 provided to convert each internal data bit iDQ to a respective data bit DQ provided on a respective I/O pin 152 of the memory device as shown, for example, in FIG. 24.

More particularly, the output driver 150 may have a primary driver circuit including transistors 130 and 140 and a supplemental driver circuit including transistors 132, 134, 142, and 144. During a read operation, an internal data bit iDQ having a logic value "1" may turn transistor 140 on and turn transistor 130 off so that I/O pin 152 is coupled through transistor 140 to ground voltage VSS and data bit DQ has a logic value "0". During a read operation, an internal data bit iDQ having a logic value "0" may turn transistor 140 off and turn transistor 130 on so that I/O pin 152 is coupled through transistor 130 to power supply voltage VDD and data bit DQ has a logic value "1". The primary driver circuit including transistors 130 and 140 thus performs the logical function of the output driver 150. The secondary driver circuit including transistors 132, 134, 142, and 144 may be disabled by providing the signal CON with a logic value "0" and by providing the inverse signal /CON with a logic value "1" so that transistors 132 and 142 are turned off.

A strength of the output driver 150 may be increased by providing the signal CON with a logic value "1" and by providing the inverse signal /CON with a logic value "0" so that transistors 132 and 142 are turned on and the secondary driver circuit is enabled. During a read operation with the secondary driver circuit enabled, an internal data bit iDQ having a logic value "1" may turn transistors 140 and 144 on and turn transistors 130 and 134 off so that I/O pin 152 is coupled through transistors 140 and 144 to ground voltage VSS and data bit DQ has a logic value "0". During a read operation with the secondary driver circuit enabled, an internal data bit iDQ having a logic value "0" may turn transistors 140 and 144 off and turn transistors 130 and 134 on so that I/O pin 152 is coupled through transistors 130 and 134 to power supply voltage VDD and data bit DQ has a logic value "1". With the secondary driver circuit enabled, the primary and secondary driver circuits perform the logical function of the output driver 150 in parallel thereby increasing a driver strength of output driver 150.

Selective mode register set operations may thus be performed for each of the memory devices 300M1-300M9 to set different output driver characteristics for different memory devices sharing a same clock/command/address bus 112. As discussed above, a selective mode register set command may be provided over address lines of the clock/command/address bus 112 during the mode register set operation, and an enabling mode register set enable/disable signal may be provided to the memory device(s) for which the mode register set command is to be applied. Moreover, a logic value of a single bit of the mode register set command may define whether all output drivers of the memory device should provide increased or reduced driver strength. In an alternative, a first selective mode register set operation may be performed for a first plurality of the memory devices for which a first output driver strength is desired, and a second selective mode register set operation may be performed for a second plurality of the memory devices for which a second output driver strength is desired.

In another alternative, a selective mode register operation may provide for different driver strengths of output drivers on a same memory device. For example, data signals DATA for a memory device may include eight data bits DQ and each memory device may include eight respective output drivers. Accordingly, eight bits of a selective mode register set command for a memory device may define a driver strength for eight respective output drivers.

While the invention has been particularly shown and described with reference to exemplary embodiments thereof, it will be understood by those of ordinary skill in the art that various changes in form and details may be made therein without departing from the spirit and scope of the invention as defined by the following claims.

That which is claimed is:

1. An integrated circuit memory device comprising:
a memory cell array;
a plurality of data input/output pins configured to receive data from a memory controller to be written to the memory cell array during a data write operation, the data input/output pins being further configured to provide data to the memory controller from the memory cell array during a data read operation; and
a mode register configured to store information defining an operational characteristic of the memory device, wherein the mode register is configured to be set using the data input/output bus.

* * * * *